United States Patent
Xie et al.

(10) Patent No.: US 10,199,271 B1
(45) Date of Patent: Feb. 5, 2019

(54) SELF-ALIGNED METAL WIRE ON CONTACT STRUCTURE AND METHOD FOR FORMING SAME

(71) Applicant: GLOBALFOUNDRIES Inc., Grand Cayman (KY)

(72) Inventors: Ruilong Xie, Niskayuna, NY (US); Guillaume Bouche, Albany, NY (US); Laertis Economikos, Wappingers Falls, NY (US); Lei Sun, Altamont, NY (US); Guoxiang Ning, Clifton Park, NY (US); Xunyuan Zhang, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/693,651

(22) Filed: Sep. 1, 2017

(51) Int. Cl.
*H01L 29/45* (2006.01)
*H01L 21/768* (2006.01)
(Continued)

(52) U.S. Cl.
CPC .. *H01L 21/76897* (2013.01); *H01L 21/28518* (2013.01); *H01L 21/7682* (2013.01);
(Continued)

(58) Field of Classification Search
CPC ........... H01L 21/76897; H01L 23/5283; H01L 21/76816; H01L 21/76805; H01L 23/5329; H01L 21/7682; H01L 23/535; H01L 29/0847; H01L 29/45; H01L 29/7851; H01L 21/28518; H01L 21/76802–21/76817
See application file for complete search history.

(56) References Cited

U.S. PATENT DOCUMENTS

2004/0198036 A1* 10/2004 Nakamura ........ H01L 21/32136
438/622
2008/0191352 A1* 8/2008 Yu ..................... H01L 21/76808
257/751
(Continued)

FOREIGN PATENT DOCUMENTS

WO 2015047321 A1 4/2015

*Primary Examiner* — Selim Ahmed
(74) *Attorney, Agent, or Firm* — Anthony Canale; Hoffman Warnick LLC

(57) ABSTRACT

A structure and method for forming a self-aligned metal wire on a contact structure. The method for forming the self-aligned metal wire and contact structure may include, among other things, forming an initial contact structure above a substrate; forming a patterned mask on the initial contact structure, the mask including an opening; using the patterned mask to form an opening through the initial contact structure; forming a dielectric layer in the openings; removing the patterned mask to expose a remaining portion of the initial contact structure; and forming the metal wire on the remaining portion of the initial contact structure. The contact structure may include a vertical cross-sectional geometry including one of a trapezoid wherein a bottom-most surface of the first contact structure is wider than an uppermost surface of the first contact structure, and a parallelogram. The metal wire may completely contact an uppermost surface of the contact structure.

8 Claims, 19 Drawing Sheets

(51) Int. Cl.
*H01L 29/78* (2006.01)
*H01L 29/08* (2006.01)
*H01L 23/535* (2006.01)
*H01L 21/285* (2006.01)
*H01L 23/532* (2006.01)
*H01L 23/528* (2006.01)

(52) U.S. Cl.
CPC .. *H01L 21/76805* (2013.01); *H01L 21/76816* (2013.01); *H01L 23/5283* (2013.01); *H01L 23/535* (2013.01); *H01L 23/5329* (2013.01); *H01L 29/0847* (2013.01); *H01L 29/45* (2013.01); *H01L 29/7851* (2013.01)

(56) References Cited

U.S. PATENT DOCUMENTS

2012/0261828 A1* 10/2012 Bruce ................. H01L 23/5222
  257/774
2015/0056800 A1 2/2015 Mebarki et al.
2015/0311082 A1* 10/2015 Bouche ............. H01L 29/41775
  257/288

* cited by examiner

SELF-ALIGNED METAL WIRE ON CONTACT STRUCTURE AND METHOD FOR FORMING SAME

BACKGROUND

The present disclosure relates to semiconductor device fabrication, and more specifically, to a self-aligned metal wire on a contact structure and methods of forming the contact structure and metal wire.

Conventional integrated circuit (IC) (i.e., chip) formation generally occurs on the surface of a semiconductor substrate, e.g., silicon wafer. ICs may include a variety of interconnected semiconductor devices such as resistors, transistors, capacitors, etc., formed on the surface of the semiconductor substrate. Due to the large number of devices and complex layout of the ICs, the devices cannot be connected within the same device level. The devices may therefore be interconnected, for example, by a complex wiring system formed in one or more layers above the device level. The wiring system may include, for example, stacked metal containing layers, i.e., metallization layers, which include metal wires providing intra-level electrical connections. The wiring system may also include layers stacked between the metallization layers including vertical structures, i.e., vias for inter-level electrical connections between the metallization.

The wiring system may be electrically connected to the semiconductor devices of the device level by a "device-level" vertical connection structure, i.e., contact structure (CA). The contact structure may be formed in an initial via layer (V0) of the device level which encloses the semiconductor devices. A first end of the contact structure may connect to a respective contact region of a semiconductor structure, e.g., a gate electrode or source and drain region of a transistor. The second end of the contact structure may connect to a respective metal wire in a metallization layer thereabove. The second end of the contact structure may be directly connected to the respective metal wire, or indirectly connected to the respective metal wire by a via.

One challenge associated with connecting the contact structure to the metallization layer may include misalignment of via and/or metal wire with the contact structure therebelow. Turning to the figures, FIG. 1 shows a semiconductor structure 100 including a conventional contact structure 112 in a dielectric layer 114 of a device layer 116. Contact structure 112 is positioned on a trench silicide structure 108 which electrically connects the contact structure to a source and drain region 106 of a fin 104 positioned in a shallow trench isolation (STI) dielectric 110 on a substrate 102. Contact structure 112 is also electrically connected to a conventional metal wire 118 in a dielectric layer 124 of a metallization layer 120 above device layer 116. As shown in FIG. 1, contact structure 112 may include a maximum width W1 of approximately 12 nanometers to approximately 50 nanometers. As shown in FIG. 1, contact structure 112 may include a vertical cross-sectional geometry of a trapezoid wherein an upper surface 126 of the contact structure is wider than a bottom surface 128 of the contact structure. Contact structure 112 may be formed, for example, by directly forming an opening (not labeled) in dielectric layer 114 and forming contact material therein. Although not shown, the conventional opening (not labeled), and therefore contact structure 112, may include a substantially circular, or ellipse top cross-sectional geometry. As shown in FIG. 1, contact structure 112 is misaligned with metal wire 118 at region 122 (in phantom). Misalignment the connections of a wiring system (e.g., conventional metal wire 118) with a conventional contact structure (e.g., contact structure 112) therebelow may result in a weak electrical connection, a higher resistance at the metal wire—contact structure interface, and variation of resistance across multiple metal wire—contact structure interfaces of a semiconductor structure. The misaligned metal wire on the contact structure may also render the semiconductor structure inoperable.

SUMMARY

A first aspect of the disclosure is directed to an integrated circuit (IC) structure including: a first contact structure in a first dielectric layer above a substrate, wherein a vertical cross-sectional geometry of the first contact structure includes one of a trapezoid wherein a bottommost surface of the first contact structure is wider than an uppermost surface of the first contact structure, and a parallelogram.

A second aspect of the disclosure is related to a method of forming a metal wire on a contact structure for an integrated circuit (IC) structure, the method including: forming the contact structure in a first dielectric layer above a substrate; forming a patterned mask on the contact structure and the first dielectric layer, wherein the patterned mask includes a first opening exposing a portion of the contact structure; using the patterned mask, forming a second opening through the contact structure at the portion of the contact structure exposed by the first opening; forming a second dielectric layer in the first opening and the second opening; removing the patterned mask to expose a remaining portion of the contact structure; and forming the metal wire on the remaining portion of the contact structure.

A third aspect of the disclosure is related to a method of forming an integrated circuit (IC) structure, the method including: forming a dummy contact structure in a first dielectric layer, the dummy contact structure contacting a trench silicide region positioned on a source drain region of a fin positioned on a substrate; forming a patterned mask on the dummy contact structure and the first dielectric layer, wherein the patterned mask includes a first opening to an exposed portion of the dummy contact structure; forming a second opening through the dummy contact structure to the trench silicide region at the exposed portion using the patterned mask; forming a second dielectric layer in the first opening and the second opening; removing the patterned mask to expose a remaining portion of the dummy contact structure; removing at least a portion of the remaining portion of the dummy contact structure to expose an uppermost surface of the trench silicide region; and forming a conductive layer on the uppermost surface of the trench silicide region, wherein the conductive layer includes the self-aligned metal wire and the contact structure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a structure and method for forming a contact structure, and a self-aligned metal wire thereon. The method may include forming a contact structure using a larger initial contact structure or dummy contact structure and patterned mask, and forming a self-aligned metal wire on the contact structure by removing the patterned mask and forming a conductive layer in place of the patterned mask. Forming the contact structure according to embodiments of the disclosure may, for example, allow for unconventional vertical cross-sectional geometries of the contact structures. Forming a self-aligned metal wire on the contact structure according to embodiments of the disclosure may also prevent and/or mitigate misalignment of the metal wire on the contact structure by forming a conductive layer for the metal wire in place of the patterned mask used to form the contact structure. Preventing and/or mitigating misalignment of the metal wire on the contact structure may, for example, reduce the resistivity at the contact structure—metal wire interface, and variation in resistivity of contact structure—metal wire interfaces across a semiconductor structure.

Figure 2:
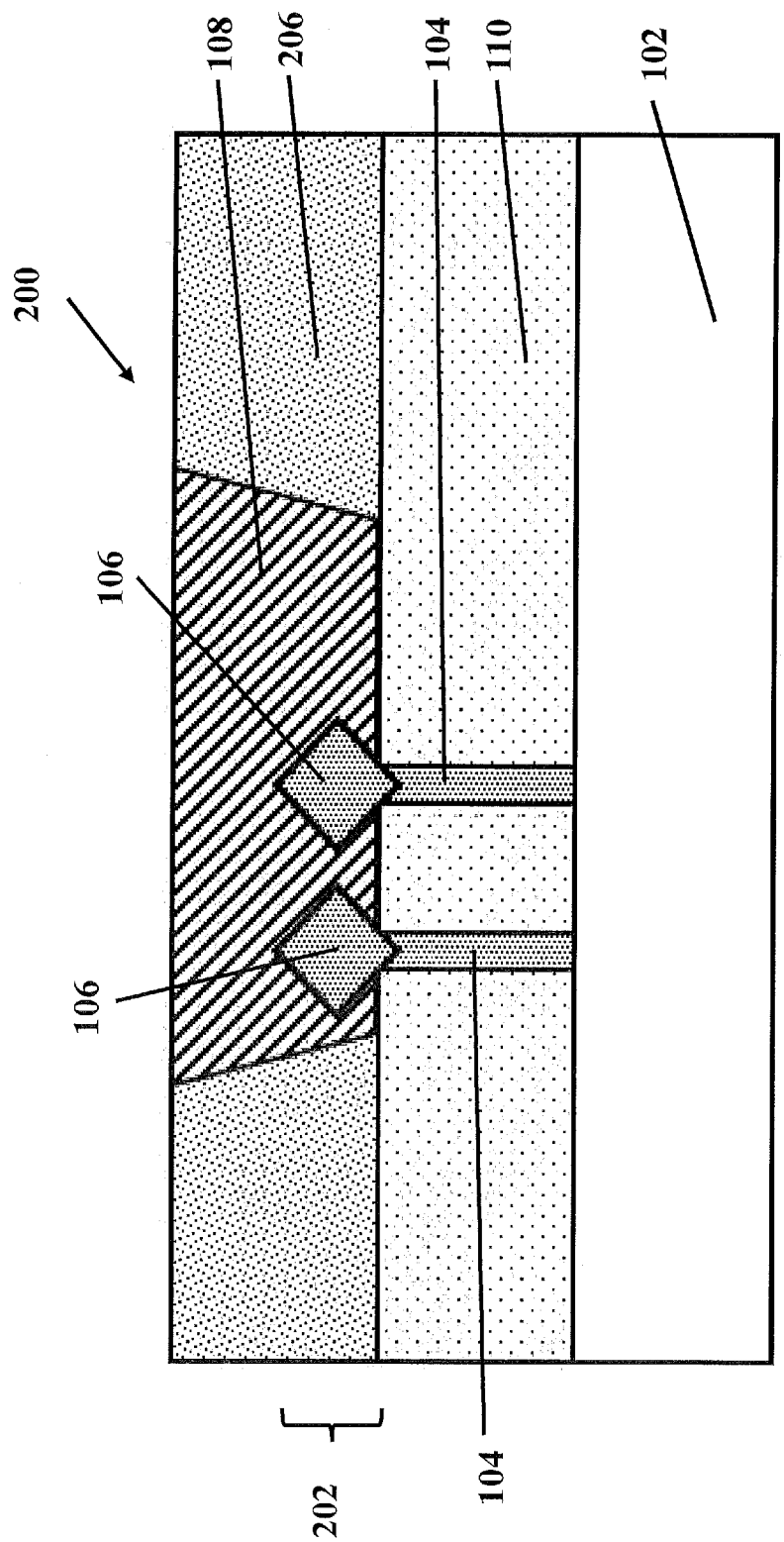
FIG. 2 shows a cross-sectional view of an initial structure for forming a contact structure and a self-aligned metal wire thereon, according to embodiments of the disclosure.

Referring to the figures, FIG. 2 shows an initial structure 200 for forming a contact structure and a self-aligned metal wire thereon, according to embodiments of the disclosure.

Initial structure 200 may include a substrate 102 upon which the remainder of initial structure 200 may be formed. Substrate 102 may be formed using any now known or later developed semiconductor fabrication techniques for forming a substrate. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entirety of each layer may be strained.

Initial structure 200 may, for example, also include fins 104 positioned on substrate 102. Although two fins are shown, initial structure 200 may include any desirable number of fins for a semiconductor structure. Fins 104 may be formed by any now known or later developed semiconductor fabrication techniques for forming a fin on a substrate. For example, as shown in FIG. 2, fins 104 may be formed by patterned epitaxial growth of substrate 102 and/or patterned etchings of substrate 102 using a patterned mask (not shown). "Epitaxy" or "epitaxial growth," as used herein, refers to a process by which a thin layer of single-crystal or large-grain polycrystalline material is deposited on a base material with similar crystalline properties. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Initial structure 200 may include, for example, a shallow trench isolation (STI) dielectric 110 formed on substrate 102 adjacent to fins 104. As shown in FIG. 2, STI dielectric 110 may be formed on a bottom portion of the sidewalls of fins 104. STI dielectric may, for example, electrically isolate fins 104 from one another and other semiconductor structures on substrate 102. STI dielectric 110 may be formed on substrate 102 adjacent to fins 104 by conventional semiconductor fabrication techniques for forming an STI dielectric layer. For example, after the formation of fins 104 on substrate 102, STI dielectric 110 may be formed by deposition, chemical mechanical planarization (CMP) and etching. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. STI dielectric 110 may include but is not limited to: silicon monoxide (SiO), silicon dioxide ($SiO_2$), and/or any another now known or later developed oxide materials. After etching STI dielectric 110, an upper portion 202 of fins 104, i.e., an active region of fins 104, may be re-exposed. As will be described herein, source and drain regions may be formed in exposed upper portions 202 of fins 104. Although not shown for purposes of simplicity, a liner layer may be formed on substrate 102 and fins 104 before forming STI dielectric 110. The liner (not shown) may, for example, act as an oxide barrier layer. The liner (not shown) may be formed by conventional semiconductor fabrication techniques and include conventional semiconductor liner materials. For example, the liner (not shown) may include silicon nitride (SiN) formed by deposition.

Although not shown in the cross-sectional view of FIG. 2, after forming STI dielectric 110, a dummy gate structure and spacer structures may be formed on STI dielectric 110, and upper portion 202 of fins 104, at cross-sections into and/or out of the page of FIG. 2. The dummy gate structure and spacer structures may be formed by conventional semiconductor fabrication techniques for forming a dummy gate structure and spacers. After the dummy gate structure (not shown) and spacer structures (not shown) are formed, source and drain regions 106 may be formed from upper portions 202 of fins 104. For example, source and drain regions 106 may be formed by epitaxial growth and/or any other now known or later developed semiconductor fabrication techniques for forming a source and drain region on a fin. Source and drain regions 106 may include, for example, a p-doped region and/or an n-doped region. N-type dopants may include but are not limited to: phosphorous (P), arsenic (As), antimony (Sb). P-type dopants may include but are not limited to: boron (B), indium (In) and gallium (Ga).

Initial structure 200 may include an initial dielectric layer 206 formed over STI dielectric 110 and source drain regions 106 of fins 104. Initial dielectric layer 206 may, for example, electrically isolate semiconductor structures formed therein. Initial dielectric layer 206 may be formed over STI dielectric 110 and source and drain regions 106 of fins 104, for example, by deposition and chemical mechanical planarization (CMP), and/or any other now known or later developed semiconductor fabrication technique for forming a dielectric layer. Initial dielectric layer 206 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Initial structure 200 may include, for example, a trench silicide structure 108 positioned on source and drain regions 106 of fins 104. Trench silicide structure 108 may, for example, be formed as a protective layer and barrier layer for source and drain regions 106. Trench silicide structure 108 may be formed in initial dielectric layer 206 using any now known or later developed semiconductor fabrication technique for forming a silicide. For example, forming trench silicide structure 108 may include forming a silicide layer (not labeled) and metallization layer (not labeled) thereon. For example, trench silicide structure 108 may be formed by: forming a trench (not labeled) in initial dielectric layer 206 (e.g., by etching by RIE using a mask); performing an in-situ pre-clean; forming a silicide layer (e.g., NiSi, NiPtSi, CoSi, TiSi) on source and drain regions 106 by depositing a metal (e.g., Ti, Ni, Co, etc.), and annealing the deposited metal; forming a metallized layer on the silicide layer by depositing a metal adhesion layer (e.g., TiN) and a bulk metal (e.g., W, Co, Ru); and planarization (e.g., CMP).

Figure 3:
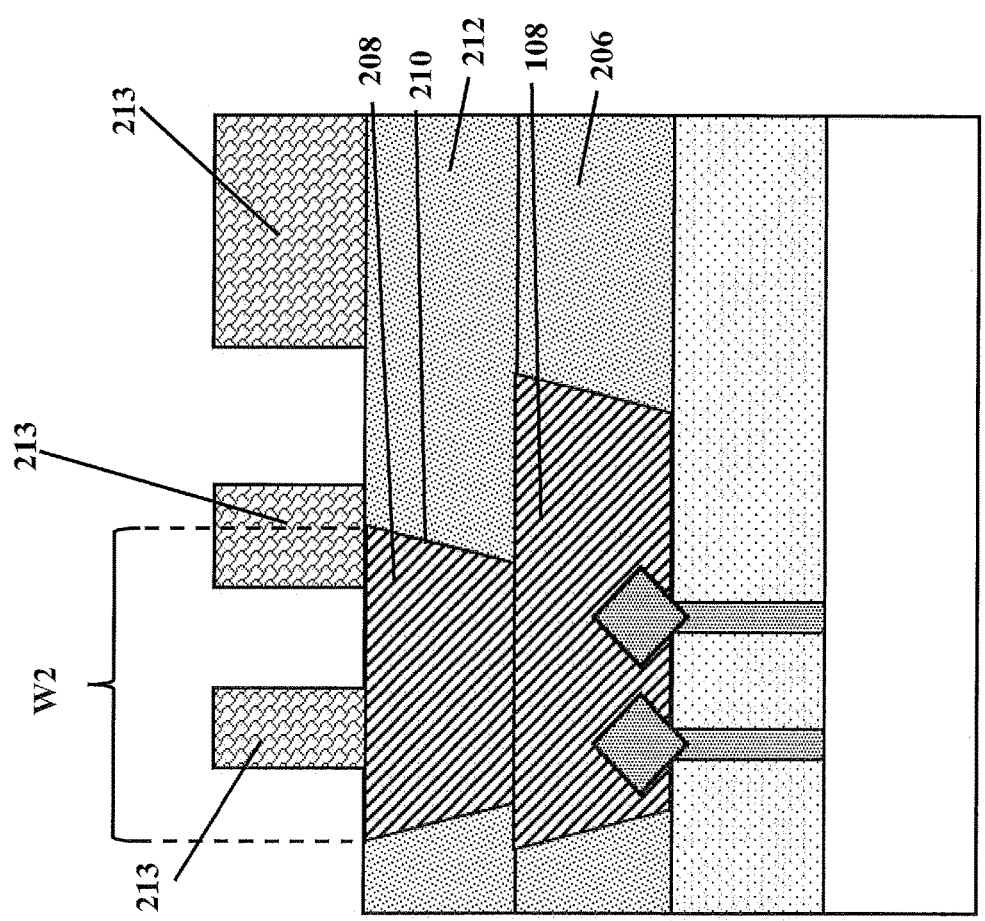
FIG. 3 shows a cross-sectional view of forming an initial contact structure, and forming a patterned mask on the initial structure of FIG. 2, according to embodiments of the disclosure.

FIG. 3 shows forming an initial contact structure 210 on trench silicide structure 108, and forming an organic planarizing layer (OPL) 213 over initial contact structure, according to embodiments of the disclosure. Initial contact structure 210 may be formed, for example, for subsequently forming contact structures therefrom. OPL 213 may be formed, for example, for use in forming a patterned mask over initial contact structure 210.

As shown in FIG. 3, initial contact structure 210 may be formed in a first dielectric layer 212 positioned on initial dielectric layer 206 and trench silicide structure 108. First dielectric layer 212 may be formed, for example, by a similar process as that described above with respect to initial dielectric layer 206. Initial contact structure 210 may be formed, for example, in first dielectric layer 212 by any now known or later developed semiconductor fabrication techniques for forming a contact structure in a dielectric layer. For example, initial contact structure 210 may be formed by forming an opening (not labeled) in first dielectric layer 212, depositing a conductive material 208 in the opening, and planarizing the conductive material. Although not shown, a liner may also be formed in the opening before conductive material 208 is formed. Conductive material 208 may include, for example, copper (Cu), tungsten (W), cobalt (Co), ruthenium (Ru) and/or any other now known or later developed conductive material for a contact structure. The liner may be formed, for example, by deposition and/or any other now known or layer developed semiconductor fabrication techniques for forming a liner. The liner may include any conventional liner material such as titanium nitride (TiN), tantalum nitride (TaN), cobalt (Co), or ruthenium (Ru) and/or any other refractory metals such as tantalum (Ta), titanium (Ti), tungsten (W), iridium (Jr), rhodium (Rh) and platinum (Pt), etc., and/or mixtures thereof.

Figure 1:
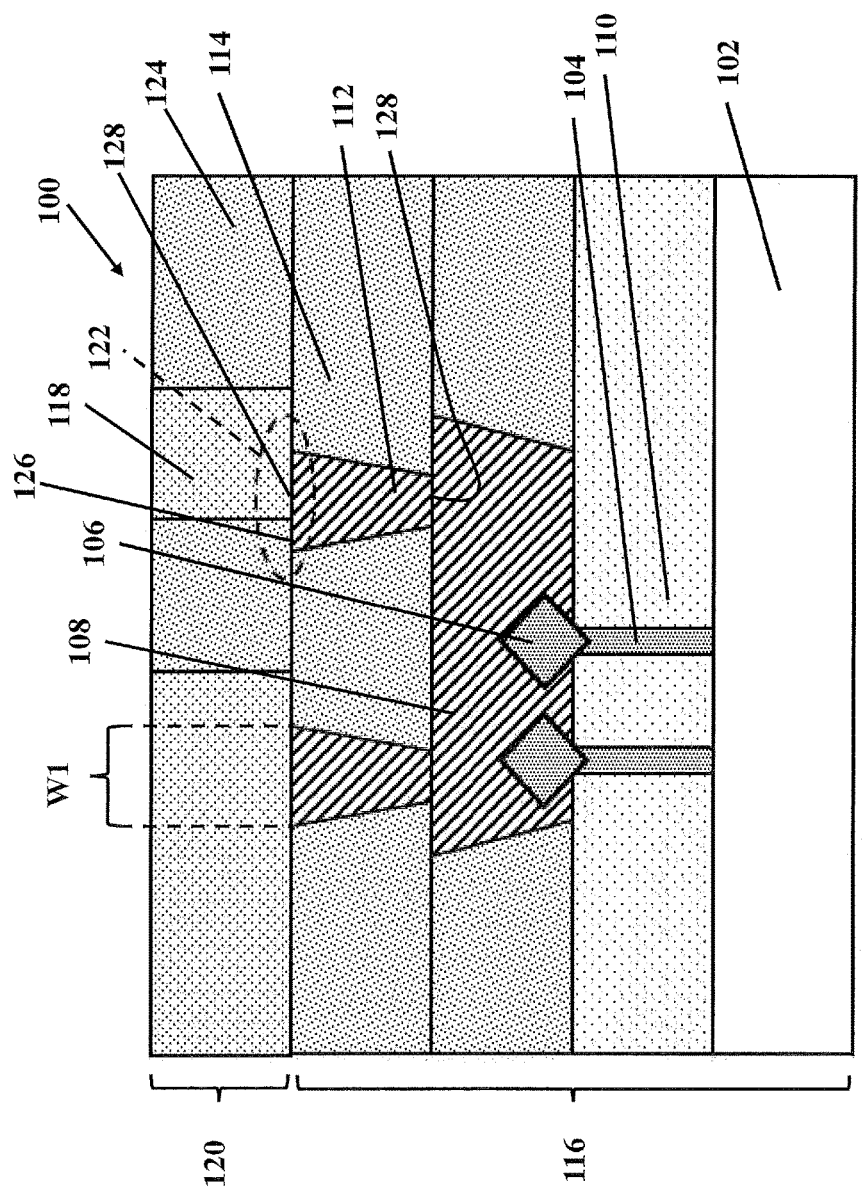
FIG. 1 shows a cross-sectional view of a conventional metal wire on a conventional contact structure.

In contrast to conventional formation of a contact structure, initial contact structure 210 may include a maximum width W2 that is larger than the maximum width W1 of conventional contact structure 112 of FIG. 1. For example, as shown in FIG. 3, initial contact structure 210 may include maximum width W2 of approximately 40 nanometers to approximately 100 nanometers. The larger maximum width of initial contact structure 210 may, for example, allow for removal of a portion of initial contact structure 210, and formation of smaller contact structure(s) (e.g., contact structures 244, 246 of FIG. 6) from the remainder(s) thereof, while maintaining a desirable maximum width for the smaller contact structure (e.g., maximum width W3 of second contact structure 246 of FIG. 6). It is understood that the maximum width of initial contact structure 210, and conventional contact structure 112 (see FIG. 1) may vary based on technology nodes.

At this point in conventional contact structure formation, a metal wire (e.g., conventional metal wire 118 of FIG. 1) would be formed in a dielectric layer (e.g., dielectric layer 124 of FIG. 1) on initial contact structure 210. As shown in FIG. 3, in contrast to conventional processes, OPL 213 may be formed on first dielectric layer 212 and initial contact structure 210, according to embodiments of the disclosure. OPL 213 may be formed, for example, for use in forming a patterned mask for removing portions of initial contact structure 210. It should be understood that although the cross-sections of OPL 213 are shown in FIG. 3, the portions of OPL 213 shown may, for example, extend into and/or out of the page of FIG. 3. OPL 213 may be formed on first dielectric layer 212 and initial contact structure 210 by conventional semiconductor fabrication techniques for forming an OPL such as deposition, patterning and etching. For example, OPL 213 may be formed by spin-on-coating an initial layer; depositing additional layers thereon; patterning the layers by a lithography process; and RIE the patterned layers to form openings (not labeled) in OPL 213 for patterned mask 214 and eventually metal wires of a first metal layer.

Figure 4:
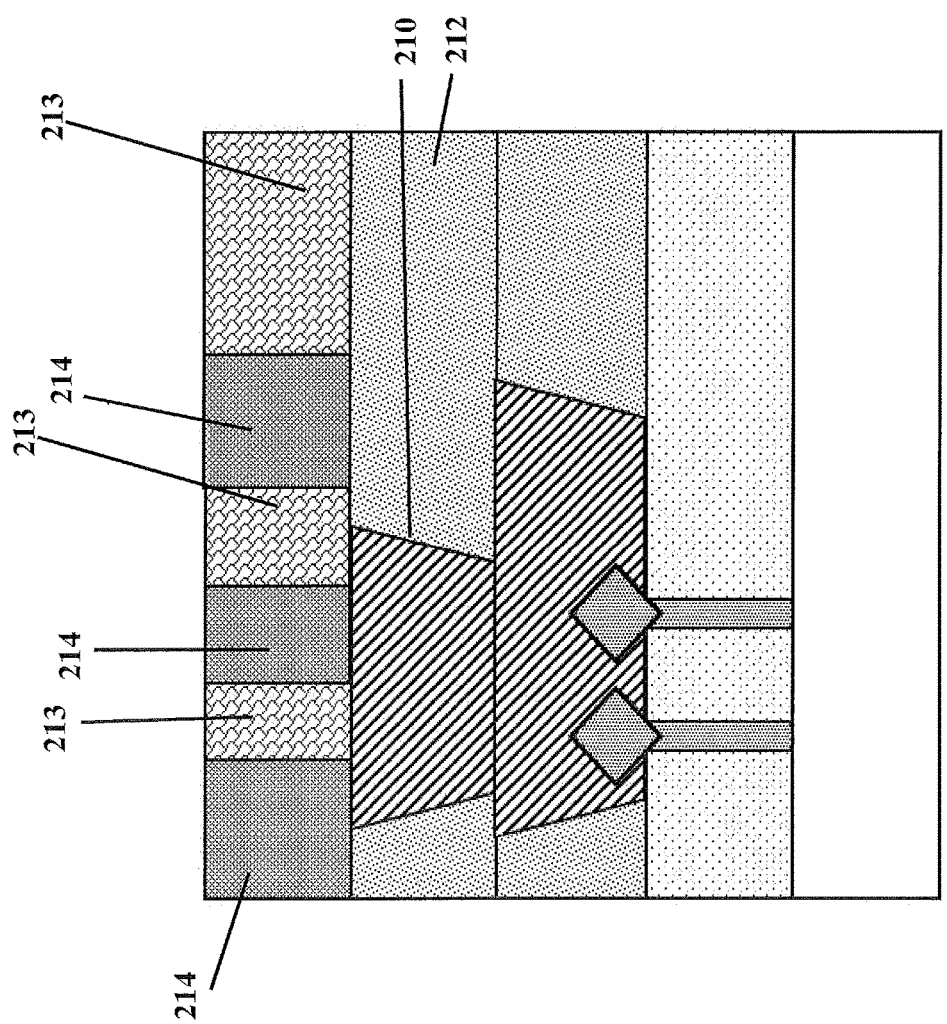
FIG. 4 shows a cross-sectional view of forming the patterned mask on the initial structure of FIG. 2, according to embodiments of the disclosure.

FIG. 4 shows forming a patterned mask 214 into the openings in OPL 213. It should be understood that similarly to OPL 213, although cross-sections of patterned mask 214 are shown in FIG. 4, the portions of patterned mask 214 may extend into and/or out of the page of FIG. 4. As will be described herein, patterned mask 214 may be used to protect portions of initial contact structure 210 and first dielectric layer 212 during removal of portions of initial contact structure 210. Additionally, patterned mask 214 may be removed, for example, for forming a self-aligned metal wire in its place (e.g., self-aligned metal wires 264, 266 of FIG. 9) on the contact structures. Patterned mask 214 may be formed in openings 214 of OPL 213, and on initial contact structure 210 and first dielectric layer 212 by plasma-enhanced atomic layer deposition (PEALD), and an etch back process. Patterned mask 214 may include, for example, silicon nitride (SiN), and/or any other now known or later developed material for a mask for patterned etching of a layer therebelow.

Figure 5:
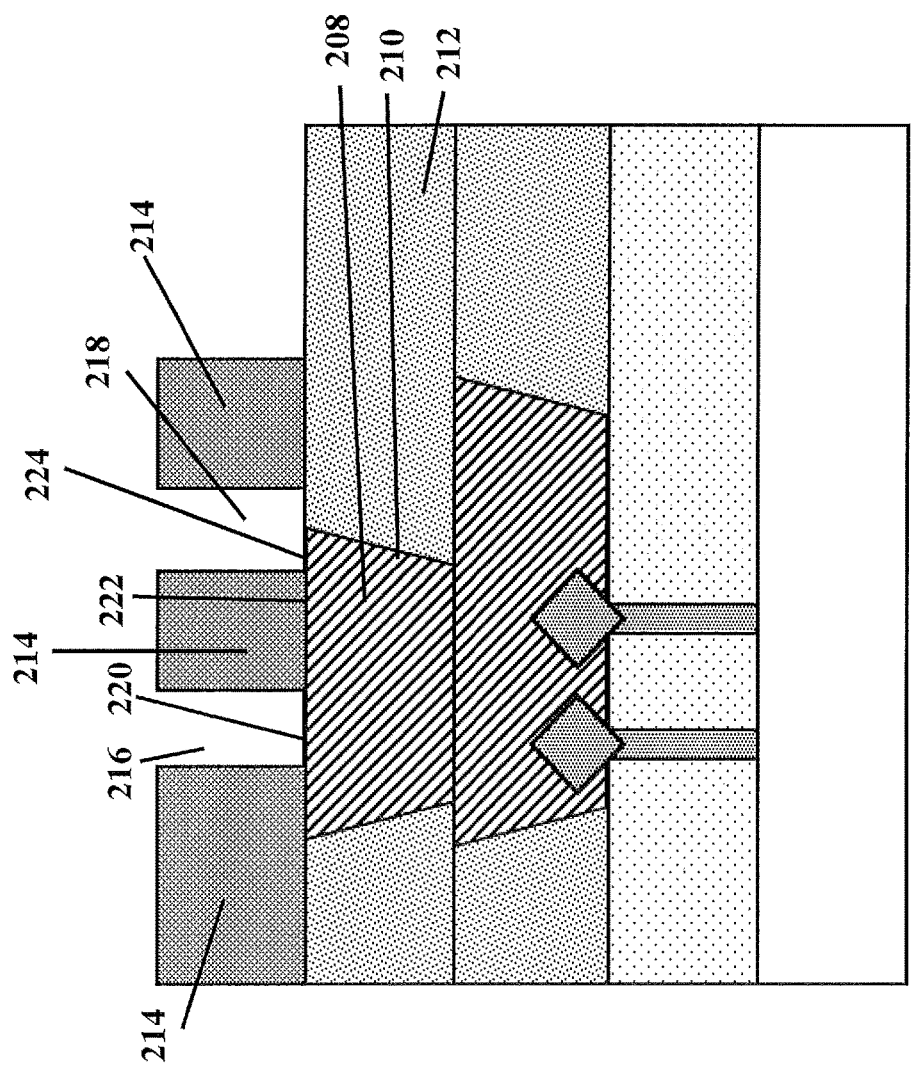
FIG. 5 shows a cross-sectional view of forming the patterned mask on the initial structure of FIG. 2, according to embodiments of the disclosure.

FIG. 5 shows removing OPL 213 to form openings 216, 218 in patterned mask 214. Openings 216, 218 may be formed, for example, to expose regions 220, 222 of an upper surface 224 of initial contact structure 210, respectively. Portions of initial contact structure 210 may be removed at exposed regions 220, 222 for example, for forming contact structures according to embodiments of the disclosure. OPL 213 may be removed, for example, by ashing. Although two openings are shown in FIG. 5, patterned mask 214 may include any number of openings for any desirable layout and number of contact structures and self-aligned metal wires for a semiconductor structure formed as described herein.

Figure 6:
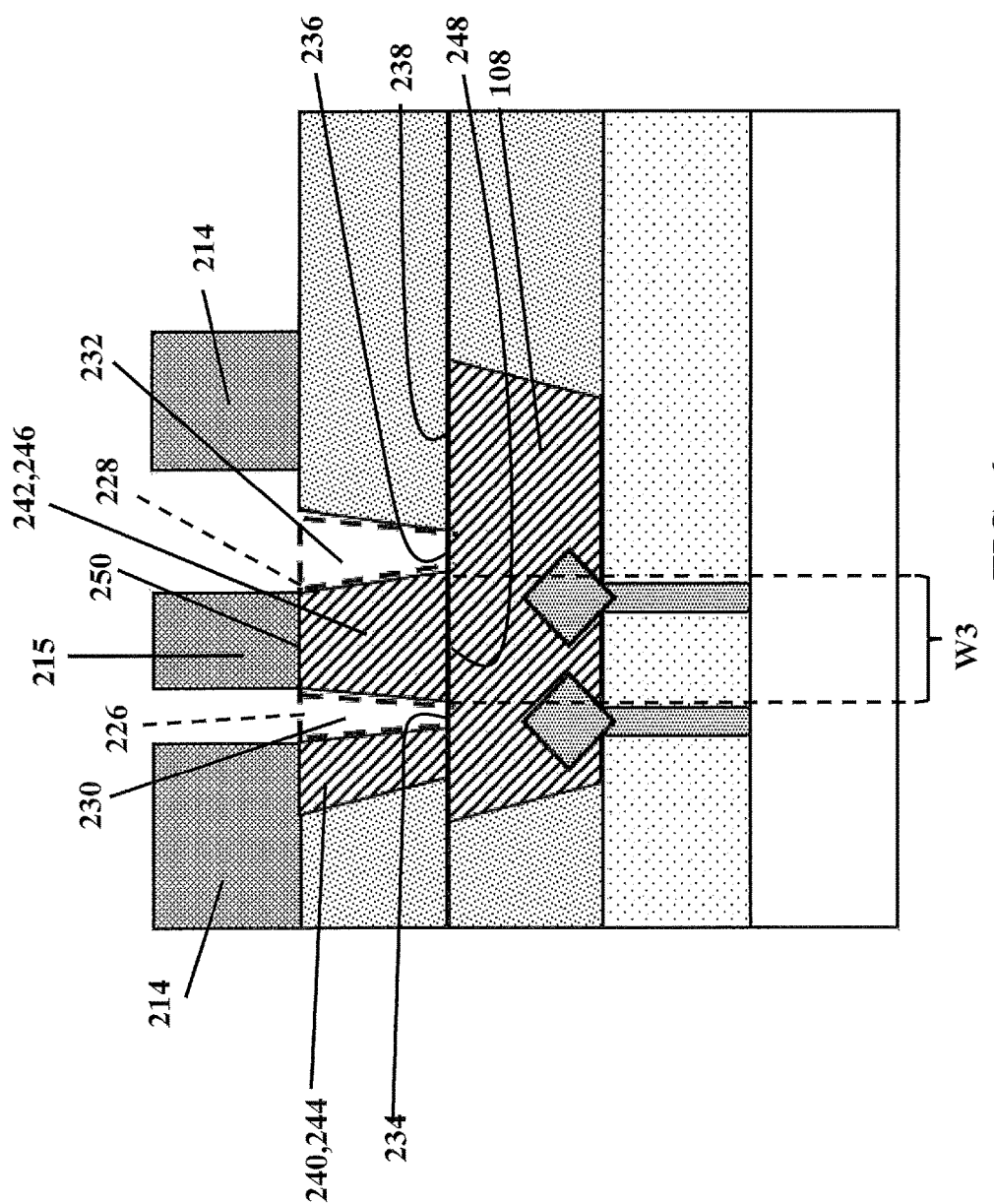
FIG. 6 shows a cross-sectional view of removing a portion of the initial contact structure using the patterned mask of FIG. 5, according to embodiments of the disclosure.

FIG. 6 shows using patterned mask 214 to remove portions 226, 228 (in phantom) of initial contact structure 210 (see FIG. 5) at exposed regions 220, 222. Portions 226, 228 (in phantom) may be removed, for example, to form contact structures from initial contact structure 210 (see FIG. 5). Removing portions 226, 228 may, for example, form openings 230, 232 in initial contact structure 210 (see FIG. 5). Openings 230, 232 may, for example, extend through initial contact structure 210 (see FIG. 5) and expose regions 234, 236 of an uppermost surface 238 of trench silicide structure 108. Openings 230, 232 may be formed, for example, by etching, e.g., etching exposed regions 220, 222, while patterned mask 214 protects the remainder of the semiconductor structure. For example, the etching may include a selective metal RIE process.

As shown in FIG. 6, after openings 230, 232 are formed in initial contact structure 210 (see FIG. 5), a first portion 240 and a second portion 242 of the initial contact structure (see FIG. 5) may remain laterally separated from one another. First portion 240 and second portion 242 may, for example, form new contact structures from initial contact structure 210 (see FIG. 5), i.e., first contact structure 244 and second contact structure 246, for a semiconductor structure. Although two remaining portions of initial contact structure 210 (see FIG. 5) are shown in FIG. 6, patterned mask 214 may include any pattern of openings to form any number of remaining portions of initial contact structure 210 (see FIG. 5) for any number of contact structures which may be desirable for the semiconductor structure. For example, although not shown, patterned mask 214 may be used to remove exposed portions of initial contact structure 210 (see FIG. 5) such that as few as one portion of the initial contact structure remains for a single contact structure. As shown in FIG. 6, in contrast to conventional contact structure 112 of FIG. 1, forming first contact structure 244 according to embodiments of the disclosure may result, for example, in first contact structure 244 including a parallelogram cross-sectional geometry. As also shown in FIG. 6, in contrast to conventional contact structure 112 of FIG. 1, forming second contact structure 246 according to embodiments of the disclosure may result in, for example, second contact structure 246 including a trapezoidal cross-sectional geometry where a bottommost surface 248 of the contact structure is wider than an uppermost surface 250 of the contact structure. Although one of each contact structure cross-sectional geometry is shown, any number of contact structures with a parallelogram or trapezoidal cross-sectional geometry as described above may be formed by the methods described herein.

Figure 7:
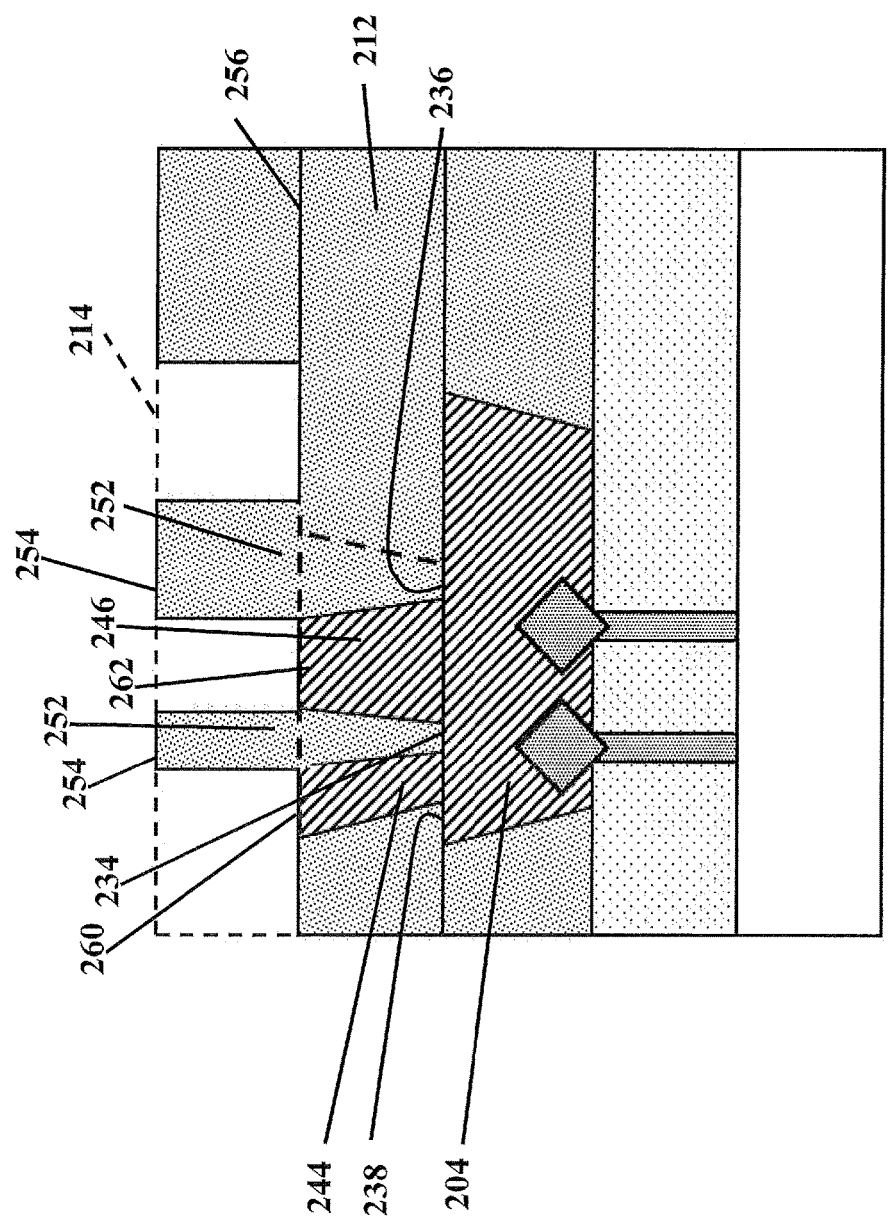
FIG. 7 shows a cross-sectional view of forming a dielectric layer in openings formed by removing the portion of the initial contact structure using the patterned mask of FIGS. 5 and 6, according to embodiments of the disclosure.

FIG. 7 shows forming a second dielectric layer 252 in openings 216, 218 (see FIG. 5), and openings 230, 232 (see FIG. 6), and removing patterned mask 214 (in phantom), according to embodiments of the disclosure. Second dielectric layer 252 may, for example, electrically and physically isolate first contact structure 244 from second contact structure 246. As will be further discussed herein with respect to FIG. 9, second dielectric layer 252 may also, for example, form part of a first metal layer M1 formed on contact structures 244, 246 (see FIG. 9). As shown in FIG. 7, second dielectric layer 252 may be formed, for example, on exposed regions 234, 236 of uppermost surface 238 of trench silicide structure 108. Also shown in FIG. 7, an uppermost surface 254 of second dielectric layer 252 may be positioned above an uppermost surface 256 of first dielectric layer 212. Second dielectric layer 252 may be formed, for example, by similar processes as those described above with respect to initial dielectric layer 206 of FIG. 2 and first dielectric layer 212 of FIG. 6.

Figure 8:
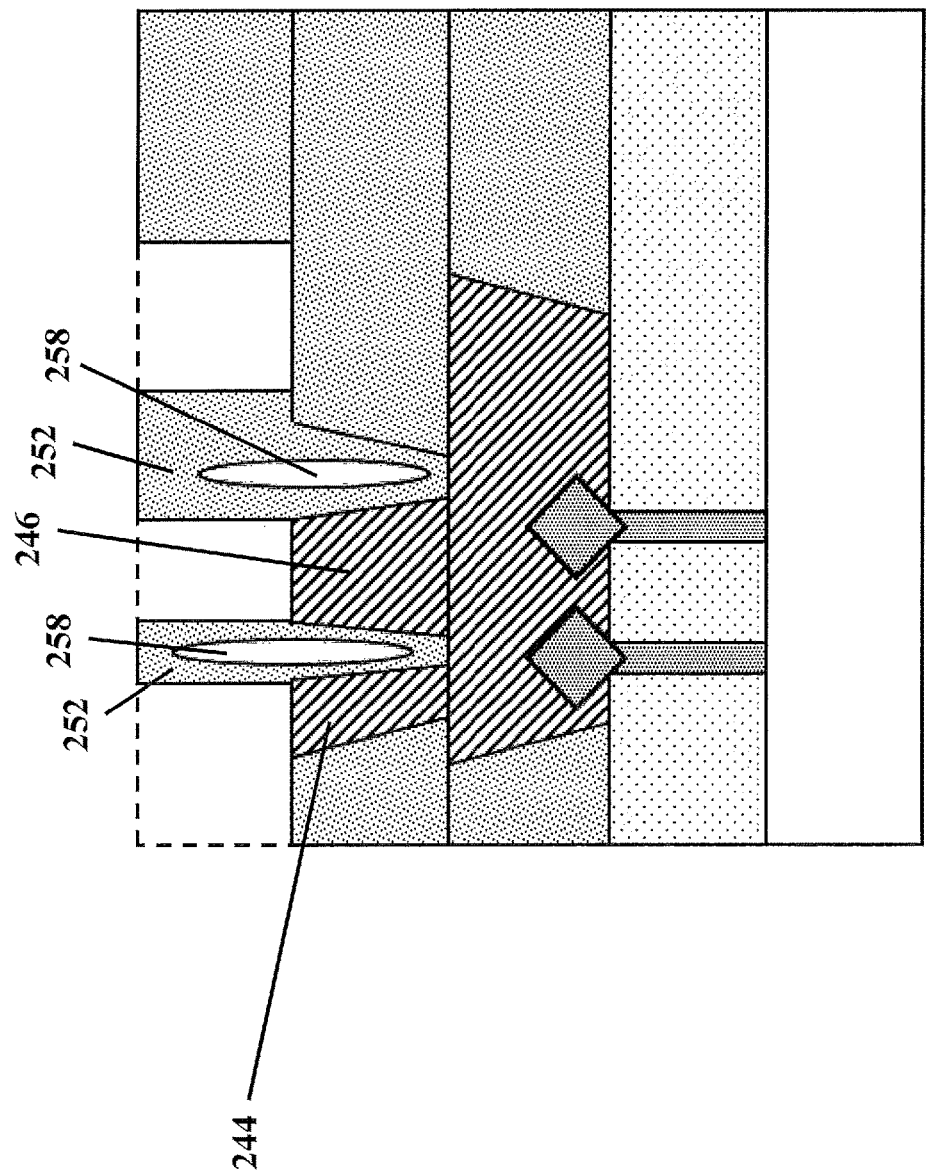
FIG. 8 shows a cross-sectional view of forming a dielectric layer, including an air gap, in openings formed by removing the portion of the initial contact structure and the patterned mask of FIGS. 5 and 6, according to embodiments of the disclosure.

FIG. 8 shows a non-limiting example of forming air gaps 258 in second dielectric layer 252. As shown in the example of FIG. 8, air gaps 258 may be formed adjacent to contact structures 244, 246. Forming air gaps 258 in second dielectric layer 252 adjacent to contact structures 244, 246 may, for example, reduce parasitic capacitance between the contact structures. Air gaps 258 may be formed in second dielectric layer 252, for example, by a non-conformal CVD deposition process which quickly pinches-off the dielectric material of second dielectric layer 252 at the opening, and/or any other now known or later developed semiconductor fabrication technique for forming an air gap in a dielectric layer. Although FIG. 8 shows two air gaps 258, any desirable number of air gaps may be formed in second dielectric layer 252 positioned in a spaced manner into and out of the page of FIG. 6.

Returning to FIG. 7, patterned mask 214 (in phantom) may be removed, for example, after second dielectric layer 252 is formed as described above. As shown in the example of FIG. 7, the removal of patterned mask 214 may expose upper surfaces 260, 262 of contact structures 244, 246. Patterned mask 214 may be removed, for example, using a selective etching process and/or any other now known or later developed semiconductor fabrication technique for selectively removing a mask. For example, where patterning mask 214 includes silicon nitride (SiN), and dielectric layer 252 includes silicon oxide ($SiO_2$), the selective etching process may include a wet etch or dry etch process which is selective to etch silicon nitride (SiN).

Figure 9:
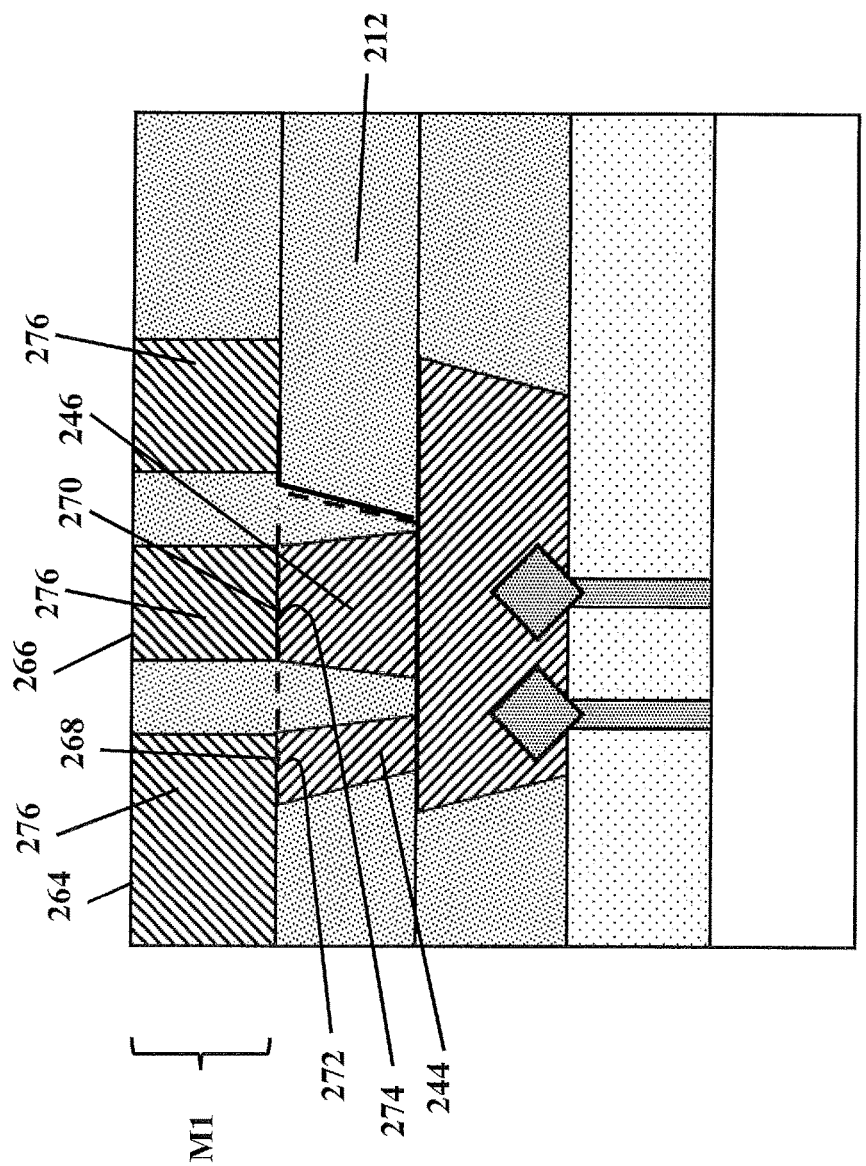
FIG. 9 shows a cross-sectional view of forming a self-aligned metal wire on remaining portions of the initial contact structure, according to embodiments of the disclosure.

FIG. 9 shows forming first metal layer M1 including self-aligned metal wires 264, 266 adjacent to portions of second dielectric layer 252 on first contact structure 244 and second contact structure 246, respectively, according to embodiments of the disclosure. It should be understood that although FIG. 9 shows a cross-section of self-aligned metal wires 264, 266, the self-aligned metal wires may extend into and/or out of the page of FIG. 9. Self-aligned metal wires 264, 266 may be formed, for example, on upper surfaces 268, 270 of contact structures 244, 246. Self-aligned metal wire 264 may be physically and electrically isolated from self-aligned metal wire 266 by second dielectric layer 252 positioned within first metal layer M1. As shown in the example of FIG. 9, in contrast to misaligned conventional metal wire 118 and conventional contact structure 112 of FIG. 1, bottom surfaces 272, 274 of self-aligned metal wires 264, 266, respectively, may completely contact upper surfaces 268, 270 of contact structures 244, 246, respectively. Forming contact structures 244, 246 and self-aligned metal wires 264, 266 by the methods described herein may therefore prevent and/or mitigate misalignment of metal wires on contact structures therebelow. Preventing and/or mitigating misalignment of metal wires 264, 266 on contact structures 244, 246 may, for example, reduce metal wire—contact structure interface resistivity, and reduce the variance of metal wire—contact structure interface resistivity across the semiconductor structure.

Self-aligned metal wires 264, 266, may be formed by any other now known or later developed semiconductor fabrication techniques for forming a metal wire. For example, self-aligned metal wires 264, 266 may be formed by deposition of a conductive layer 276 on first dielectric layer 212 and upper surfaces 268, 270 of contact structures 244, 246, and planarizing the conductive layer. Conductive layer 276 may include, for example, tungsten, cobalt (Co), copper (Cu), Ruthenium (Ru), and/or any other now known or later developed conductive material for metal wires in a metal layer. Although not shown, a liner may be formed on upper surfaces 268, 270 of contact structures 244, 246, and on second dielectric layer 252 in first metal layer M1 before forming conductive layer 276. The liner may be formed by similar methods and include similar materials as those described above with respect to FIG. 5.

FIGS. 10-15 show alternative embodiments for forming a self-aligned metal wire on a contact structure using a dummy contact structure formed on initial structure 200 of FIG. 2. In contrast to forming a self-aligned metal wire on a contact structure using initial contact structure 210 (see FIG. 5), here forming a self-aligned metal wire on a contact structure may include, for example, partially or completely removing a portion of a dummy contact structure, and forming a conductive layer in its place to form both a self-aligned metal wire and a contact structure.

Figure 10:
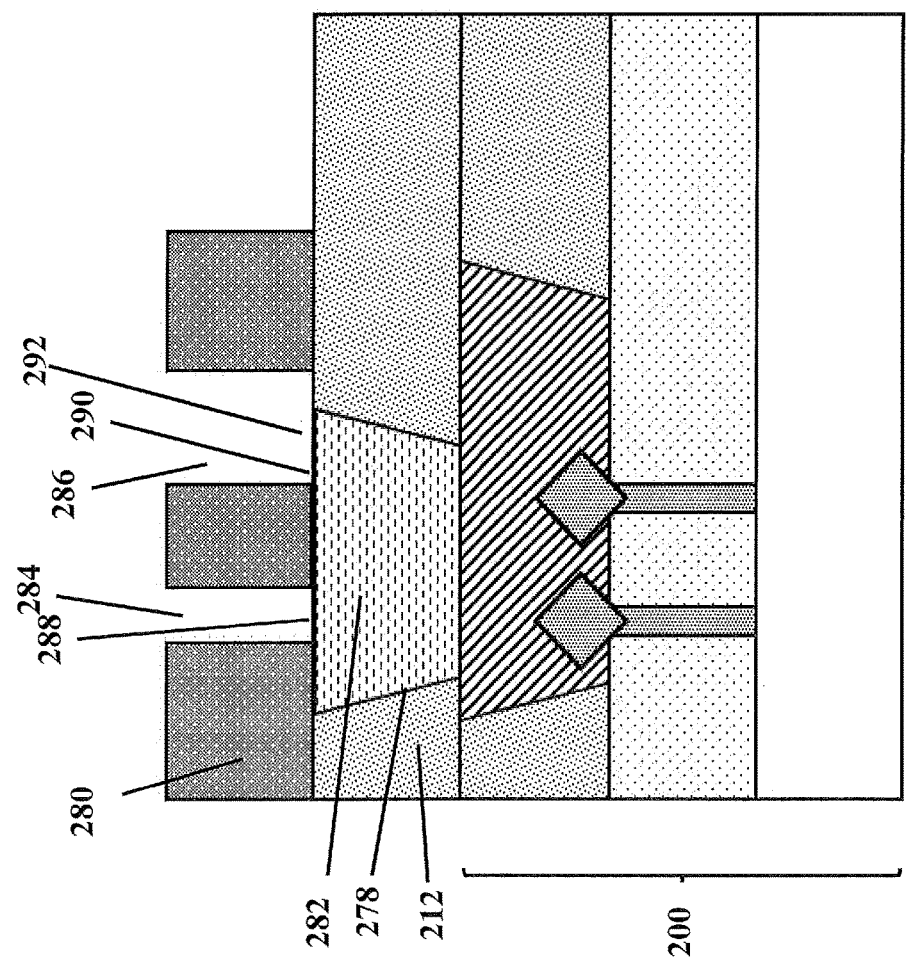
FIG. 10 shows a cross-sectional view of forming a dummy contact structure, and a patterned mask on the initial structure of FIG. 2, according to embodiments of the disclosure.

FIG. 10 shows forming a dummy contact structure 278 on initial structure 200 of FIG. 2, and a patterned mask 280 on dummy contact structure 278, according to embodiments of the disclosure. Dummy contact structure 278 may be formed in a first dielectric layer 212 on initial structure 200 of FIG. 2 by similar processes as those described above with respect to first dielectric layer 212 and initial contact structure 210 of FIG. 3. For example, first dielectric layer 212 may be formed by deposition on initial structure 200 of FIG. 2, and dummy contact structure 278 may be formed by forming an opening (not labeled) in first dielectric layer 212, and depositing a sacrificial material 282 in the opening. Sacrificial material 282 may include, for example, a non-metallic material such as amorphous silicon (aSi), deep ultraviolet light absorbing oxide (DUO), and/or any other now known or later developed sacrificial material.

Patterned mask 280 may, for example, be formed by similar processes, and include similar materials as those described above with respect to patterned mask 214 of FIG. 5. Patterned mask 280 may include, for example, openings 284, 286 exposing regions 288, 290 of upper surface 292 of dummy contact structure 278. Similarly to patterned mask 214, although two openings are shown in FIG. 10, patterned mask 280 may include any number of openings for any desirable layout and number of contact structures and self-aligned metal wires for a semiconductor structure formed as described herein.

Figure 11:
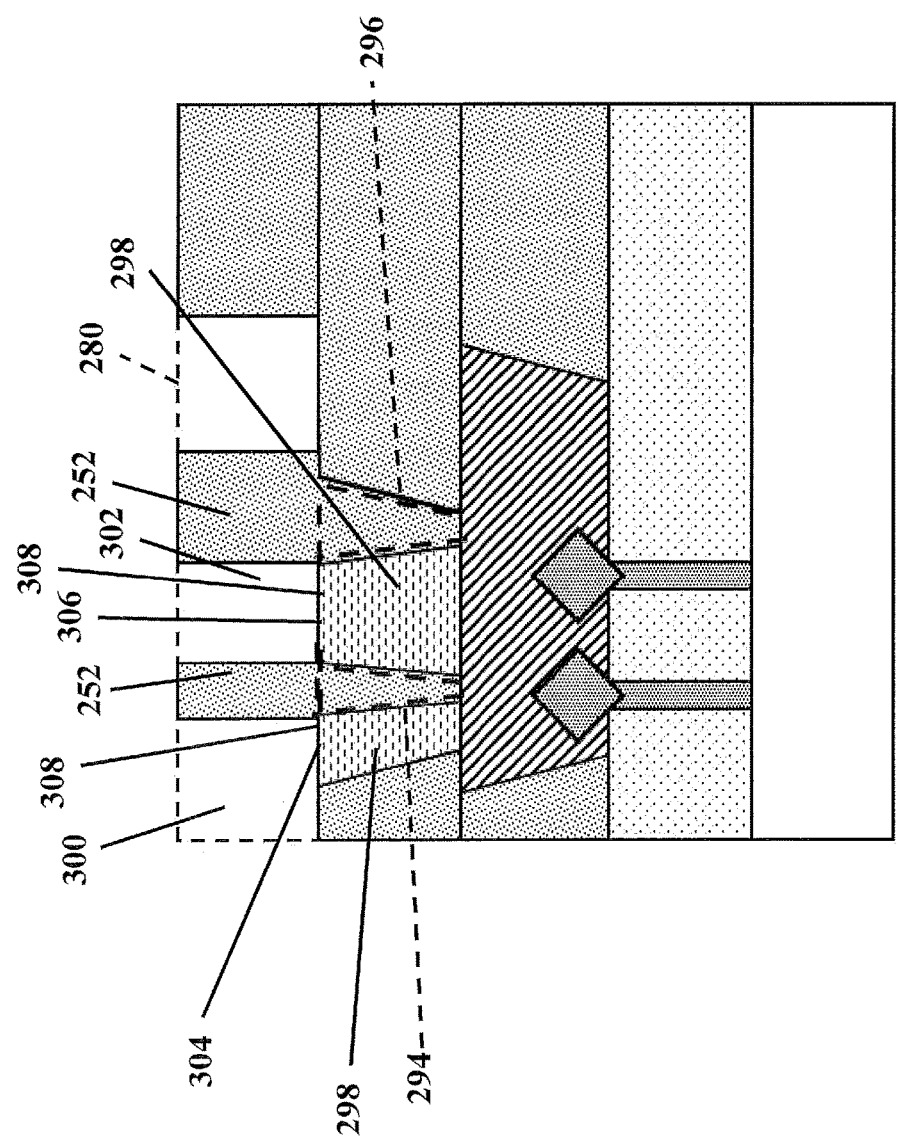
FIG. 11 shows a cross-sectional view of removing a portion of the dummy contact structure of FIG. 10, depositing a dielectric layer, and removing the patterned mask of FIG. 10, according to embodiments of the disclosure.

FIG. 11 shows removing a first portion 294 (in phantom) and second portion 296 (in phantom) of dummy contact structure 278 (see FIG. 10), forming a second dielectric layer 252, and removing patterned mask 280, according to embodiments of the disclosure.

Removing portions 294, 296 (in phantom) of dummy contact structure 278 (see FIG. 10) may, for example, form openings (not labeled) in dummy contact structure 278 (see FIG. 10). As shown in FIG. 11, portions 298 may remain after removing portions 294, 296 (in phantom) of dummy contact structure 278 (see FIG. 10). Second dielectric layer 252 may be formed in the openings (not labeled) of dummy contact structure 278 (see FIG. 10), and openings 284, 286 (see FIG. 10) of patterned mask 280 (in phantom). Second dielectric layer 252, physically and electrically isolates subsequently formed contact structures 320, 322 (see FIG. 13) from one another, and self-aligned metal wires 320, 322 (see FIG. 13) from one another. Patterned mask 280 (in phantom) may be removed to form openings 300, 302 which expose upper regions 304, 306 of upper surface 308 of remaining portion 298 of dummy contact structure 278 (see FIG. 10) for removing a portion thereof, as will be described herein.

First portion 294 (in phantom), and second portion 296 (in phantom) of dummy contact structure 278 (see FIG. 10) may be removed, for example, by similar processes as those described above with respect to portions 226, 228 (see FIG. 6) of initial contact structure 210 (see FIG. 3). For example, first portion 294 (in phantom) and second portion 296 (in phantom) may be removed by etching, e.g., RIE. Second dielectric layer 252 may, for example, be formed by similar processes, and include similar materials as those described above with respect to second dielectric layer 252 of FIG. 7. Patterned mask 280 may be removed, for example, by similar processes as those described above with respect to patterned mask 214 of FIG. 6.

Figure 12:
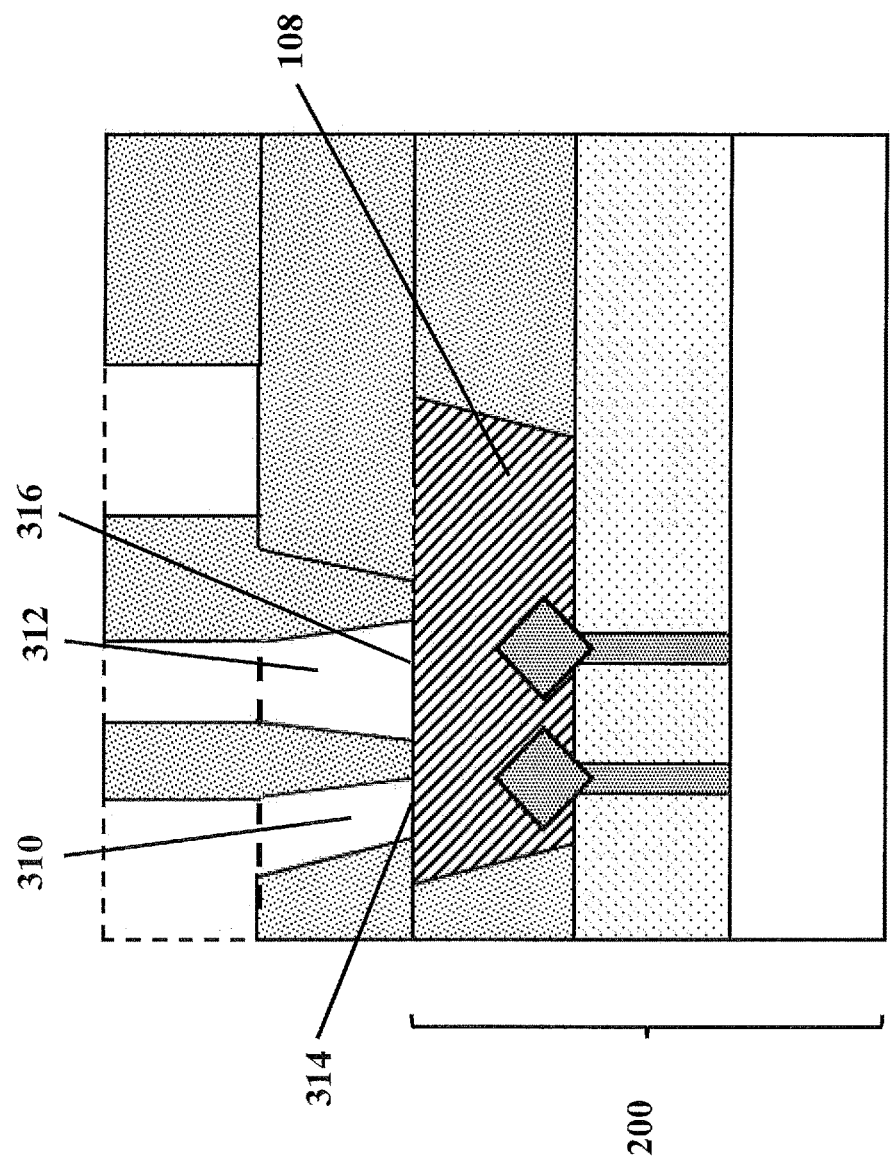
FIG. 12 shows a cross-sectional view of removing a remaining portion of the dummy contact structure of FIG. 11, according to embodiments of the disclosure.

FIG. 12 shows completely removing remaining portion 298 (see FIG. 11) of dummy contact structure 278 (see FIG. 10), according to embodiments of the disclosure. Removing remaining portion 298 (see FIG. 11) may, for example, form openings 310, 312 exposing regions 314, 316 of the upper surface of trench silicide structure 108 of initial structure 200 for later forming contact structure and self-aligned metal wires thereon. Remaining portion 298 (see FIG. 11) may be removed, for example, by selective etching and/or any other now known or later developed semiconductor fabrication techniques for removing a sacrificial material.

Figure 13:
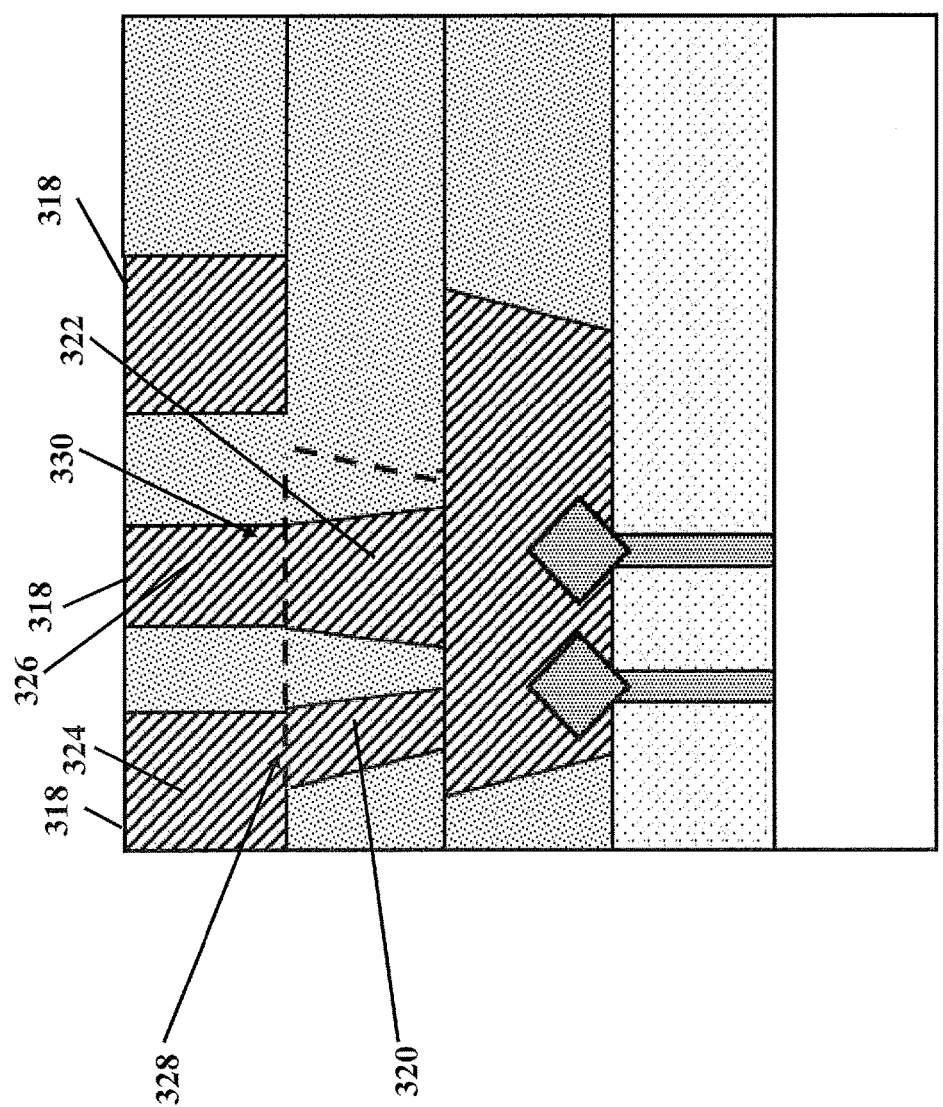
FIG. 13 shows a cross-sectional view of forming a conductive layer on the structure of FIG. 13 to form a contact structure and a self-aligned metal wire thereon, according to embodiments of the disclosure.

FIG. 13 shows forming a conductive layer 318 in openings 300, 302 (see FIG. 11) and openings 310, 312 (see FIG. 12) for forming a first contact structure 320, a second contact structure 322, a first self-aligned metal wire 324, and a second self-aligned metal wire 326, according to embodiments of the disclosure. It should be understood that although FIG. 13 shows a cross-sectional view of self-aligned metal wire 326, self-aligned metal wire 326 may extend into and/or out of the page of FIG. 13. Although not shown, a liner may be formed, for example, in openings 300, 302 (see FIG. 11) and openings 310, 312 (see FIG. 12) before forming conductive layer 318. The liner may be formed by similar methods and include similar material as those described above with respect to FIG. 3. Conductive layer 318 may be formed, for example, by similar processes and include similar materials as described above with respect to conductive material 208 of contact structures 244, 246 of FIG. 6, and conductive layer 276 of self-aligned metal wires 264, 266 of FIG. 9.

As shown in FIG. 13, completely removing remaining portion 298 (see FIG. 11) of dummy contact structure 278 (see FIG. 10) may, for example, result in first self-aligned metal wire 324 and first contact structure 320 being formed from a unitary portion 328 of the material of conductive layer 318, and second self-aligned metal wire 326 and second contact structure 322 being formed from a unitary portion 330 of the material of conductive layer 318. As also shown in FIG. 13, forming self-aligned metal wires 324, 326 and contact structures 320, 322 as described herein may prevent and/or mitigate misalignment of the metal wire on the contact structure. For example, because patterned mask 280 (see FIG. 10) covers portions 298 (see FIG. 12) of dummy contact structure 278 (see FIG. 10) during removal of portions 294, 296 (see FIG. 10), the patterned mask is aligned with portions 298. Openings 334, 336 (see FIG. 14) are formed by removing portions 298 (see FIG. 12) and therefore patterned mask 280 (see FIG. 10) is also aligned with openings 334, 336 (see FIG. 14). Openings 300, 302 (see FIG. 12) are subsequently formed by removing pre-aligned patterned mask 280 (see FIG. 10) and are therefore also aligned with openings 334, 336 (see FIG. 14). As a result, metal wires 324, 326 are self-aligned with contact structures 320, 322 when conductive layer 318 is formed within the openings. Preventing and/or mitigating misalignment of metal wires 324, 326 on contact structures 320, 322 may, for example, reduce metal wire—contact structure interface resistivity, and reduce the variance of metal wire—contact structure interface resistivity across the semiconductor structure.

Similarly to first contact structure 244 of FIG. 6, in contrast to conventional contact structure 112 of FIG. 1, first contact structure 320 formed as described herein using dummy contact structure 278 (see FIG. 10) may include, for example, a parallelogram cross-sectional geometry. As also shown in FIG. 13, in contrast to conventional contact structure 112 of FIG. 1, second contact structure 322 may include, for example, a trapezoidal cross-sectional geometry, where the bottom portion of the contact structure is wider than the top portion of the contact structure. As discussed above with respect to contact structures 244, 246 of FIG. 6, although one contact structure with each cross-sectional geometry is shown, any number of contacts with either cross-sectional geometry may be formed according to embodiments of the disclosure.

Figure 14:
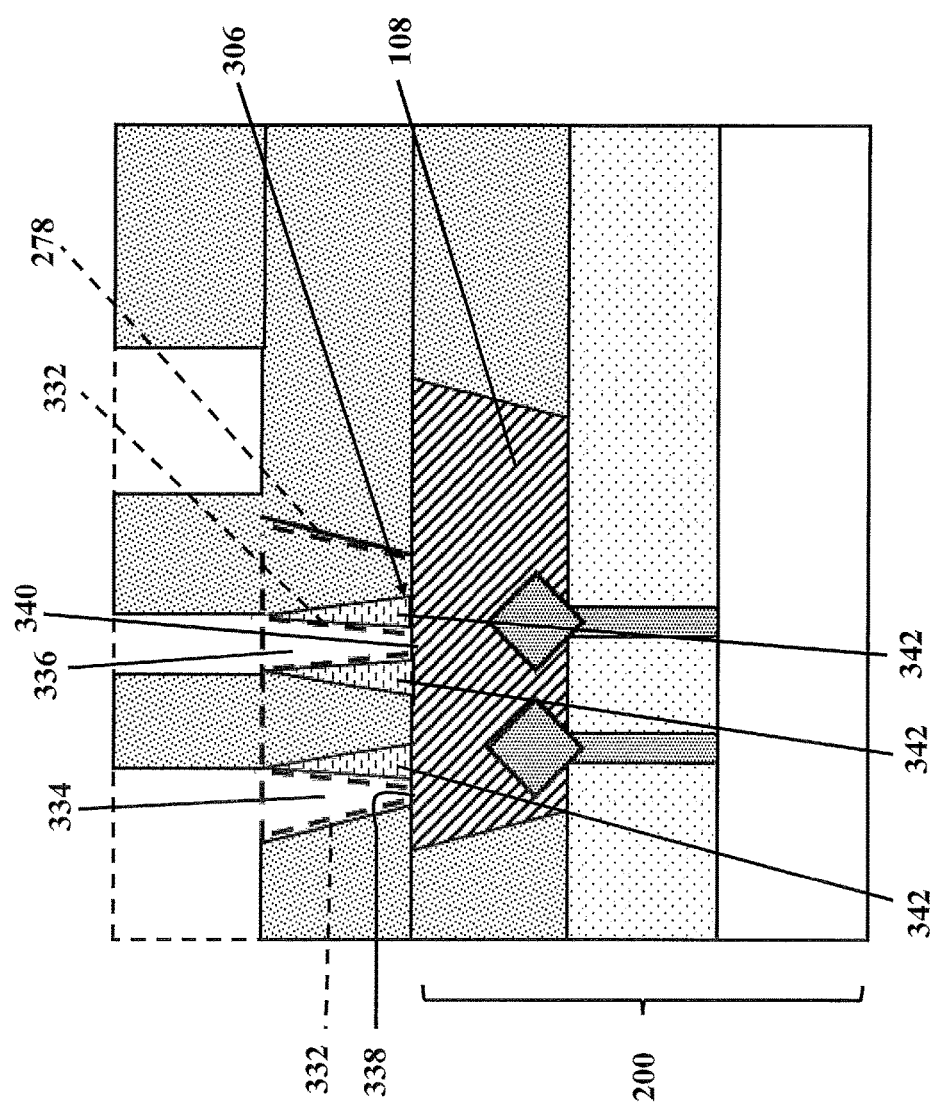
FIG. 14 shows a cross-sectional view of removing a portion of the remaining portion of the dummy contact structure of FIG. 11, according to embodiments of the disclosure.
Figure 15:
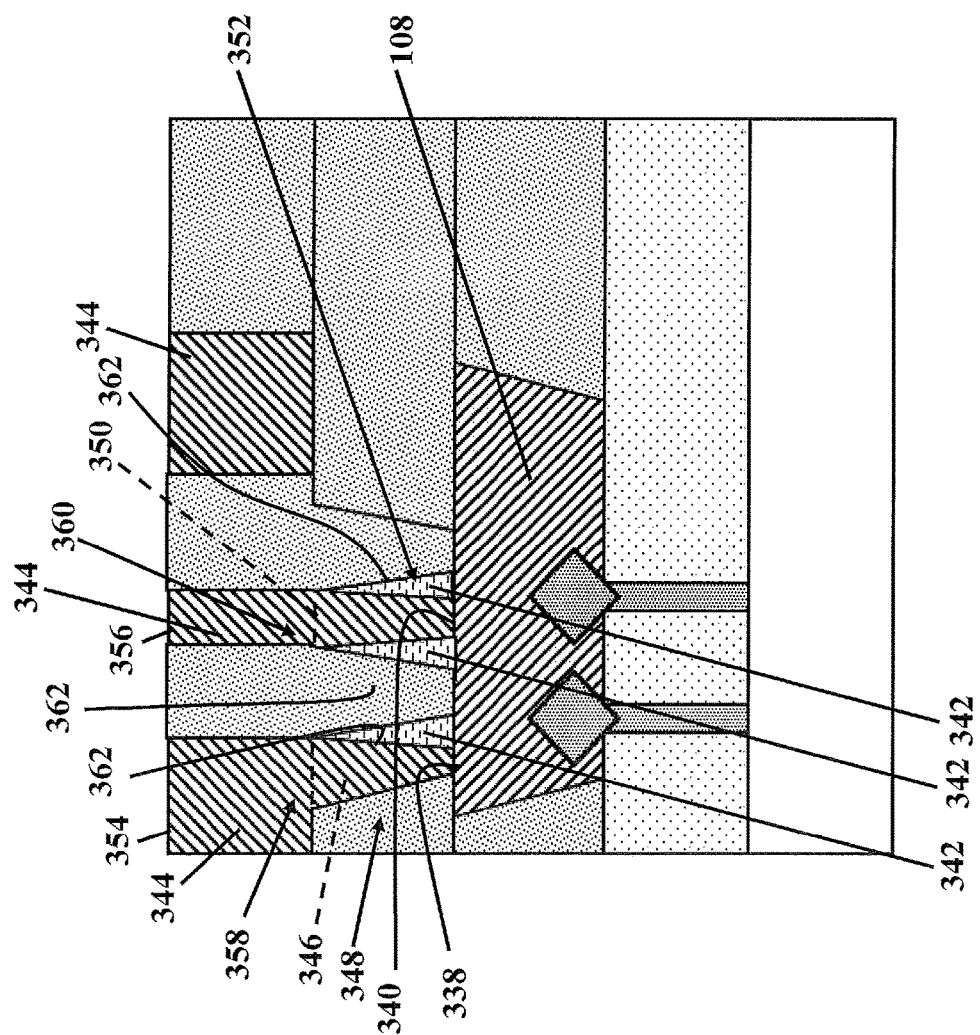
FIG. 15 shows a cross-sectional view of forming a conductive layer on a remaining portion of the dummy contact structure of FIG. 14 to form a contact structure and a self-aligned metal wire thereon, according to embodiments of the disclosure.

In contrast to the example of FIG. 12, FIGS. 14-15 show forming self-aligned metal wires on contact structures by removing only a portion of the remaining portion 298 (see FIG. 11) of dummy contact structure 278 (see FIG. 10). As will be discussed herein with respect to FIG. 15, forming a self-aligned metal wire on a contact structure by removing only a portion of the remaining portion of a dummy contact structure may result in a contact structure including a portion of conductive material surrounded by a portion of non-metallic material. As will also be discussed herein, forming a contact structure as described below may result in the contact structure including a conductive region with a conventional trapezoidal geometry where an upper portion of the contact structure is wider than a bottom portion of the contact structure.

FIG. 14 shows removing only a first portion 332 (in phantom) of remaining portion 298 (see FIG. 11) of dummy contact structure 278 (see FIG. 10), according to embodiments of the disclosure. Removing first portion 332 (in phantom) of remaining portion 298 (see FIG. 11) may, for example, form openings 334, 336 which expose regions 338, 340 of the upper surface of trench silicide structure 108 of initial structure 200. As shown in FIG. 14, a second portion 342 of remaining portion 298 (see FIG. 11) may remain adjacent to openings 334, 336. First portion 332 (in phantom) of remaining portion 298 (see FIG. 11) may be removed, for example, by anisotropic dry etching and/or any other now known or later developed semiconductor fabrication techniques for removing a portion of a sacrificial material.

FIG. 15 shows forming a conductive layer 344 in openings 300, 302 (see FIG. 11) and openings 334, 336 (see FIG. 14) on exposed regions 338, 340 of the upper surface of trench silicide structure 108, according to embodiments of the disclosure. Conductive layer 344 may, for example, form a portion 346 (in phantom) of a first contact structure 348 and a portion 350 (in phantom) of a second contact structure 352, a first self-aligned metal wire 354, and a second self-aligned metal wire 356, on trench silicide structure 108. It should be understood that although FIG. 15 shows a cross-sectional view of self-aligned metal wires 354, 356, the self-aligned metal wires may extend into and/or out of the page of FIG. 13. Conductive layer 344 may be formed, for example, by similar processes and include similar materials as described above with respect to conductive material 208 of contact structures 244, 246 of FIG. 6 and/or conductive layer 276 of self-aligned metal wires 264, 266 of FIG. 9. Although not shown, a liner may be formed in openings 300, 302 (see FIG. 11) and openings 334, 336 (see FIG. 14) on exposed regions 338, 340 of the upper surface of trench silicide structure 108 before forming conductive layer 344. The liner may be formed by similar methods and include similar material as those described above for a liner with respect to FIG. 3.

As shown in FIG. 15, removing first portion 332 (see FIG. 14) of remaining portion 298 (see FIG. 11) of dummy contact structure 278 (see FIG. 10) may, for example, result in first self-aligned metal wire 354 and first contact structure 348 being formed from a unitary portion 358 of conductive layer 344, and second self-aligned metal wire 356 and second contact structure 352 being formed from a unitary portion 360 of conductive layer 344. Forming first contact structure 348, second contact structure 352, first self-aligned metal wire 354, and second self-aligned metal wire 356 as described herein may prevent and/or mitigate misalignment of the metal wire on the contact structure. For example, because patterned mask 280 (see FIG. 10) covers portions 298 (see FIG. 12) of dummy contact structure 278 (see FIG. 10) during removal of portions 294, 296 (see FIG. 10), the patterned mask is aligned with portions 298. Openings 334, 336 (see FIG. 14) are formed by removing portions 298 (see FIG. 12) and therefore patterned mask 280 (see FIG. 10) is also aligned with openings 334, 336 (see FIG. 14). Openings 300, 302 (see FIG. 12) are subsequently formed by removing pre-aligned patterned mask 280 (see FIG. 10) and are therefore also aligned with openings 334, 336 (see FIG. 14). As a result, metal wires 354, 356 are self-aligned with contact structures 348, 352 when conductive layer 318 is formed within the openings. Preventing and/or mitigating misalignment of metal wires 354, 356 on contact structures 348, 352 may, for example, reduce metal wire—contact structure interface resistivity, and reduce the variance of metal wire—contact structure interface resistivity across the semiconductor structure.

As shown in the example of FIG. 15, in contrast to contact structures 320, 322 of FIG. 13, contact structures 348, 352 may include respective portions 342 of sacrificial material 282 (see FIG. 11) along sidewalls 362 of the contact structures, adjacent to respective portions of conductive layer 344 therein. As shown in FIG. 15, forming contact structure 352 as described above may result in portion 350 (in phantom) of conductive layer 344 positioned within second contact structure 352 including, for example, a conventional trapezoidal cross-sectional geometry where an upper portion of the contact structure is wider than a bottommost portion of the contact structure. Forming contact structures portion 350 (in phantom) of contact structure 352 to include portions 342 may, for example, mitigate and/or prevent formation of a void which may otherwise occur where portions 342 remain during formation of conductive layer 344. Further, preventing and/or mitigating the voids formed in a contact structure may, for example, reduce the resistance of the contact structure.

Figure 16:
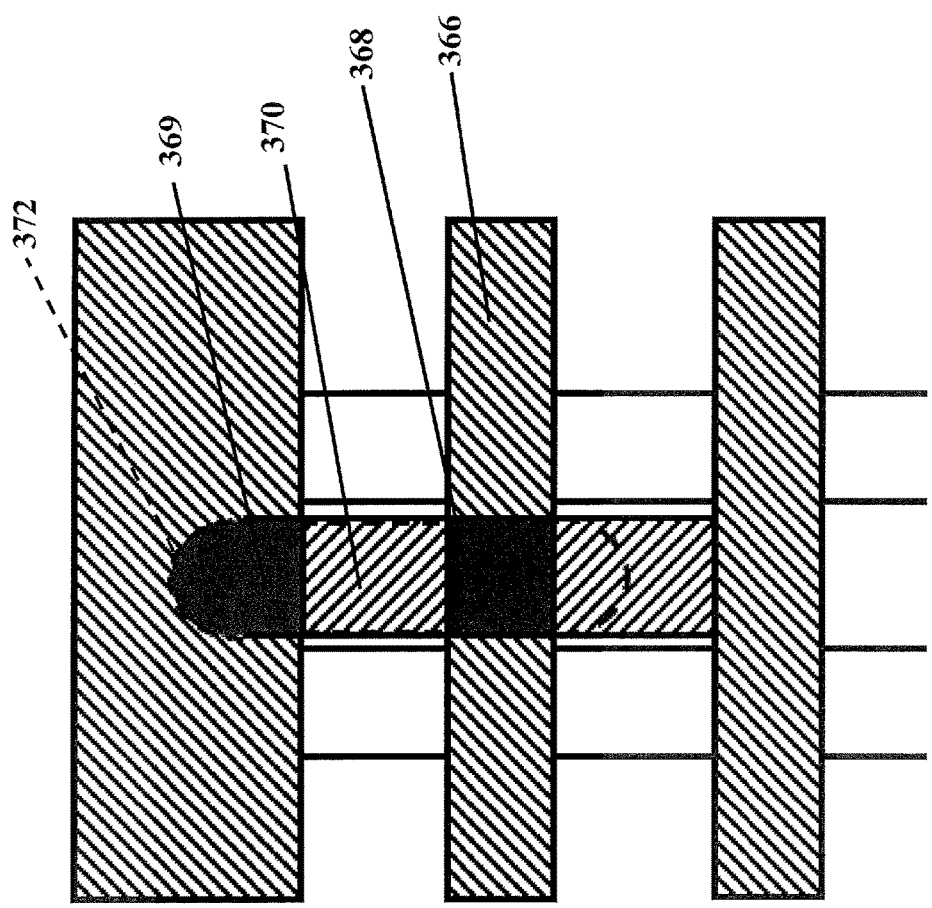
FIG. 16 shows a plan-view of a self-aligned metal wire on a contact structure on a trench silicide structure, according to embodiments of the disclosure.

FIG. 16 shows a plan-view of a self-aligned metal wire 366 and contact structures 368, 369 formed according to embodiments of the disclosure. Self-aligned metal wire 366 and contact structures 368, 369 may be formed on a trench silicide structure 370 positioned on a source and drain region (not shown) of a fin (not shown). Self-aligned metal wire 366 and contact structures 368, 369 may be formed, for example, by processes similar to those described above with respect to self-aligned metal wire 266 and second contact structures 244, 246 of FIG. 9. In another non-limiting example, self-aligned metal wire 366 and contact structure 368 may be formed by processes similar to those described above with respect to self-aligned metal wire 326 and contact structures 320, 322 of FIG. 13. In yet another non-limiting example, self-aligned metal wire 366 and contact structure 368 may be formed by processes similar to those described above with respect to contact structures 348, 352 and self-aligned metal wire 354 of FIG. 15.

As shown in FIG. 16, in contrast to conventional contact structure 112 of FIG. 1, forming self-aligned metal wire 366 on contact structures 368, 369 according to the embodiments of the present disclosure may result in contact structures 368, 369 including a top cross-sectional geometry with one or no rounded edges. For example, during the formation of contact structure 368, portions of initial contact structure 372 (in phantom) may be removed from both sides of the subsequently formed contact structure. As a result, in addition to the non-conventional trapezoidal vertical cross-sectional geometry discussed above with respect to, e.g., contact structure 246 of FIG. 9, contact structure 368 may include a substantially square top cross-sectional geometry. As also shown in FIG. 16, in another example, during the formation of contact structure 369, portions of initial contact structure 372 (in phantom) may be removed from one side of the subsequently formed contact structure. As a result, in addition to the parallelogram vertical cross-sectional geometry discussed above with respect to, e.g., contact structure 244 of FIG. 9, contact structure 369 may include a top cross-sectional geometry with only one rounded side. Forming contact structures 368, 369 to include a top cross-sectional geometry with one or no rounded edges may improve edge placement variation between the contact structure and the metal wires formed thereon. Forming contact structures 368, 369 according to embodiments of the disclosure may also, for example, improve line end critical dimension uniformity (CDU). Improving edge placement variation and CDU may, for example, reduce metal wire—contact structure interface resistivity, and the variation in metal wire—contact structure interface resistivity across the semiconductor structure.

Although FIGS. 2-16 show forming a self-aligned metal wire on a contact structure positioned on a trench silicide structure (i.e., trench silicide structure 108 of FIG. 2), forming a self-aligned metal wire on a contact structure according to embodiments of the disclosure may include, for example, forming a self-aligned metal wire on a contact structure positioned on other semiconductor structures, e.g., directly on source and drain regions of fins of a semiconductor structure, a gate positioned on fins of a semiconductor structure, etc.

Figure 17:
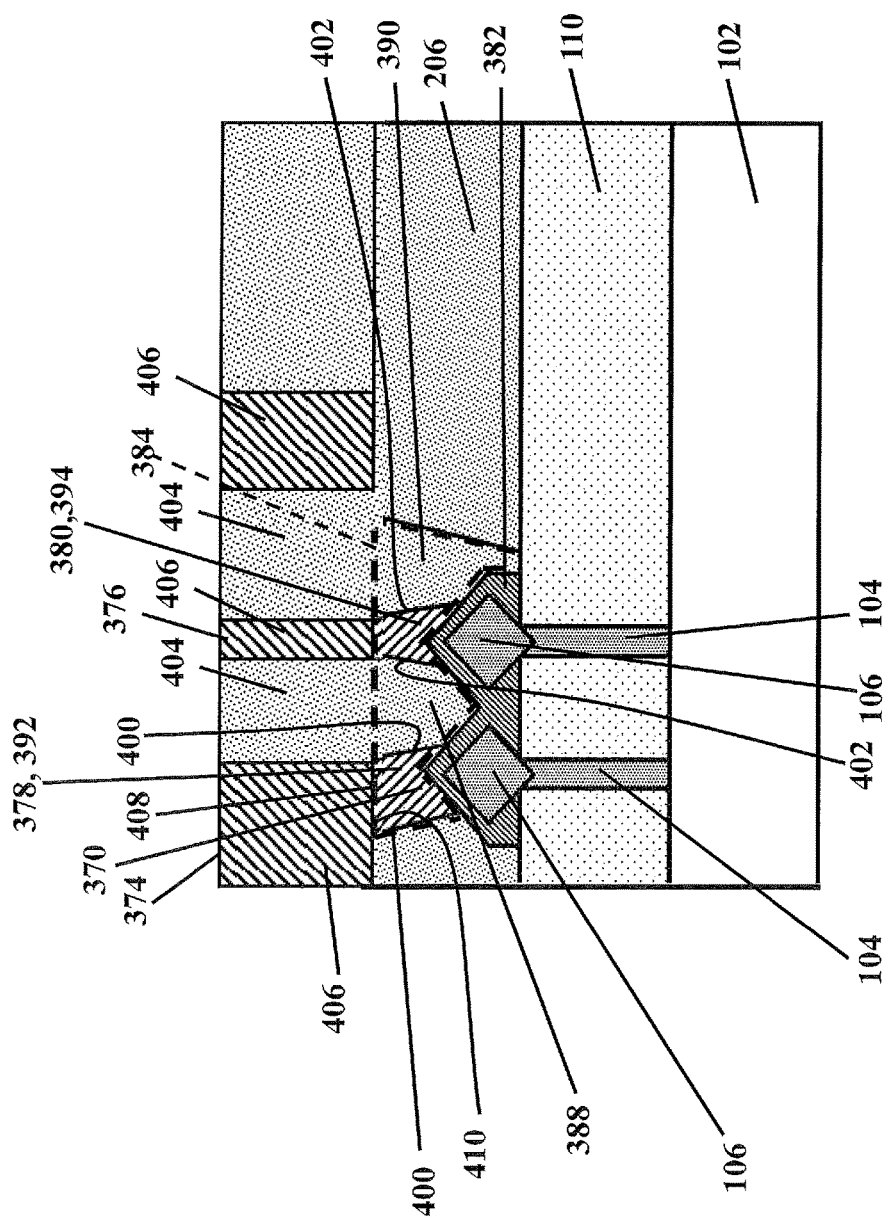
FIG. 17 shows a cross-sectional view of forming a contact structure on a source and drain region of a fin, and forming a self-aligned metal wire on the contact structure, according to embodiments of the disclosure.

FIG. 17 shows forming self-aligned metal wires on contact structures positioned directly on a silicide region of source and drain regions of fins. As shown in FIG. 17, a silicide region 382 may be formed on source and drain regions 106 of fins 104 in contrast to trench silicide structure 108 of initial structure 200 of FIG. 2.

Fins 104 including source and drain regions 106, and STI dielectric 110, may be formed on substrate 102 by the same and/or similar methods and materials as those set forth above with respect to like numbered structures in FIG. 2. After source and drain regions 106 are formed, silicide region 382 may be formed thereon. Silicide region 382 may be formed, for example, by: performing an in-situ pre-clean; depositing a metal such as titanium, nickel, cobalt, etc.; annealing the deposited metal; and removing any unreacted metal. A dielectric layer 206 may be formed on substrate 102, fins 104 and silicide region 382 by the same and/or similar methods and materials as those described above with respect to like numbered structures in FIG. 2. As shown in FIG. 17, in contrast to FIGS. 2-16 an initial contact structure 384 (in phantom) may be formed in a dielectric layer 206 on silicide region 382. Initial contact structure 384 may be formed, for example, by forming a trench (not labeled) in first dielectric layer 206 to silicide region 382, and depositing and planarizing conductive material in the trench. Initial contact structure 384 (in phantom) may include similar materials as described above with respect to first initial contact structure 210 of FIG. 3. Once initial contact structure 384 (in phantom) is formed, patterned mask 214 of FIG. 5 may be formed on initial contact structure 384 and dielectric layer 206 for removing portions of initial contact structure 384 (in phantom) to form contact structures therefrom. Portions 388, 390 of initial contact structure 384 (in phantom) may be removed, for example, by etching e.g., RIE using patterned mask 214 to protect the remainder of the semiconductor structure from further processing. After portions 388, 390 are removed, portions 392, 394 of initial contact structure 384 may remain, laterally separated from one another. Portions 392, 394 may form contact structure 378, 380, respectively. After portions 388, 390 have been removed, a dielectric layer 404 may be formed in place of portions 388, 390, for example, by deposition and planarization of dielectric material. Dielectric layer 404 may, for example, electrically isolate contact structures 378, 380. After dielectric layer 404 has been formed, patterned mask 214 of FIG. 5 may be removed, for example, by selective RIE. Self-aligned metal wires 374, 376 may be formed on contact structures 378, 380, respectively, in place of patterned mask 214. Self-aligned metal wires 374, 376 may be formed, for example, by deposition and planarization of a conductive layer 406. Although not shown, another liner, such as ruthenium and/or any other refractory metals, may be deposited on contact structures 378, 380 before forming conductive layer 406. Conductive layer 406 may include for example, tungsten and/or any other conductive material desirable for the metal wires. As shown in FIG. 17, in contrast to conventional contact structure 112 of FIG. 1, contact structure 380 may include sidewalls 402 which extend away from one another from the top of the contact structure to the bottom of the contact structure. Further, a bottom surface 408 of metal wires 374, 376 may completely contact an upper surface 410 of contact structures 378, 380. Forming contact structures 378, 380 and metal wires 374, 376 as described herein may therefore prevent and/or mitigate misalignment of metal wires 374, 376 on contact structures 378, 380

Figure 18:
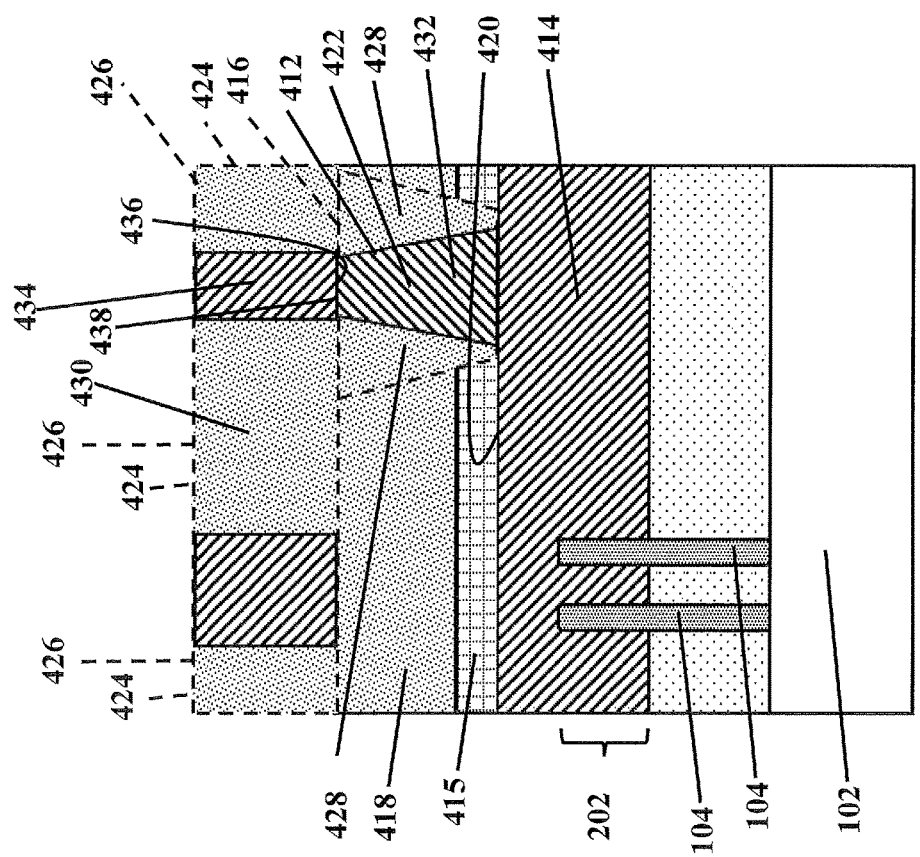
FIG. 18 shows a cross-sectional view of forming a contact structure on a gate structure, and forming a self-aligned metal wire on the contact structure, according to embodiments of the disclosure.

FIG. 18 shows another non-limiting example of forming a self-aligned metal wire on a contact structure positioned on a gate structure. The cross-sectional view of FIG. 18 may include, for example, a cross-section of fins 104 further in or out of the plane of FIGS. 2-15, and 15.

Fins 104 may be formed on substrate 102 by similar processes as those described above with respect to fins 104 in FIG. 2. STI dielectric 110 may then also be formed on substrate 102 and adjacent to fins 104 as described above with respect to STI dielectric 110 in FIG. 2. Substrate 102, fins 104, and STI dielectric 110 may include the same or similar materials as those described above with respect to like numbered structures in FIG. 2. During formation of STI dielectric 110, an upper portion 202 of fins 104 may be re-exposed for forming source and drain regions (not shown) in fins 104 into and/or out of the page of FIG. 18, and as described above with respect to FIG. 2.

Although not shown, a dummy gate structure may be formed on upper portions 202 fins 104 and STI dielectric 110 to protect portions of fins 104 and STI dielectric 110 during the formation of source and drain regions (not shown). After the source and drain regions (not shown) are formed, the dummy gate structure (not shown) may be removed.

As shown in FIG. 18, a gate structure 414 may be formed on upper portions 202 of fins 104 and STI dielectric 110. Gate structure 414 may be formed, for example, in place of the dummy gate structure (not shown). Gate structure 414 may be formed by conventional semiconductor fabrication techniques and conventional materials for forming a gate structure on a fin. A gate cap layer 415 may be formed on gate structure 414, for example, to protect the gate structure during additional processing of the semiconductor structure. Gate cap layer 415 may be formed by conventional methods and materials for forming a cap layer on a gate. For example, cap layer 415 may be formed by deposition and planarization of a nitride such as silicon nitride (SiN).

A dielectric layer 418 may be formed on gate structure 414, for example, to electrically insulate that gate structure from other semiconductor structures. Dielectric layer 418 may be formed by conventional semiconductor fabrication techniques for forming a dielectric layer, for example, deposition and planarization. Dielectric layer 418 may include similar materials as those described above with respect to initial dielectric layer 206 of FIG. 2.

An initial contact structure 416 (in phantom) may then be formed in dielectric layer 418 for forming contact structures therefrom. Initial contact structure 416 (in phantom) may be formed in dielectric layer 418 and gate cap layer 415 by forming a trench (not labeled) to upper surface 420 of gate structure 414 by RIE, depositing a conductive material 422 in the trench, and planarizing the conductive material. Although not shown, a liner, such as ruthenium and/or any other refractory metals, may be formed in the trench (not labeled) before forming conductive material 422 in the trench.

A patterned mask 424 (in phantom) may be formed on initial contact structure 416 for removing portions of initial contact structure 416 (in phantom) for forming contact structures. Patterned mask 424 may be formed, for example, by steps of deposition, patterning and etching. For example, patterned mask 424 may be formed by: forming an organic planarization layer (OPL) on dielectric layer 418; forming openings in the OPL in the desired pattern for patterned mask 424; forming silicon nitride (SiN) in the openings to form the patterned mask; and removing the remainder of the OPL. Patterned mask 424 may include, for example, silicon nitride (SiN) and/or any other now known or later developed material for a mask for patterned etching of a layer therebelow.

Patterned mask 424 (in phantom) may include openings 426 (in phantom) exposing portions 428 of initial contact structure 416 for removal to form a contact structure. Portions 428 of initial contact structure 416 may be removed, for example, by etching while patterned mask 424 (in phantom) protects the remainder of the contact structure. As shown in FIG. 18, the etching may, for example, be a wet or dry etch selective to remove the material of initial contact structure 416 (in phantom). As shown in FIG. 18, a portion 432 of initial contact structure 416 may remain after removing portion 428. Portion 432 may form contact structure 412.

A dielectric layer 430 may be formed in the openings (not labeled) formed by removing portions 428 of initial contact structure 416 (in phantom), for example, to electrically isolate contact structure 416 (in phantom) from other semiconductor structures. Dielectric layer 430 may be formed, for example, by conventional semiconductor fabrication techniques such as deposition and planarization. Dielectric layer 418 may include similar materials as those described above with respect to initial dielectric layer 206 of FIG. 2. Although not shown, air gaps may be formed, for example, in dielectric layer 430, adjacent to contact structure 416, by the same or similar methods as those described above for forming air gaps 258 in FIG. 6.

Patterned mask 424 (in phantom) may be removed after forming dielectric layer 430, for example, to provide openings for forming metal wires therein. Patterned mask 424 (in phantom) may be removed, for example, by selective RIE. A self-aligned metal wire 434 may be formed in an opening (not labeled) above contact structure 412 formed after removing patterned mask 424 (in phantom). For example, self-aligned metal wire 434 may be formed on contact structure 412 by deposition and planarization of conductive material in place of patterned mask 424. Although not shown, a liner, such as ruthenium and/or any other refractory metals, may be formed on contact structure 412 before forming conductive material thereon. As shown in FIG. 18, a bottom surface 436 of metal wire 434 may completely contact an upper surface 438 of contact structure 412. Forming metal wire 434 on contact structure 412 positioned on gate structure 414 as described herein may therefore prevent and/or mitigate misalignment of the metal wire on the contact structure. Additionally, as shown in FIG. 18, in contrast to conventional contact structure 112 of FIG. 1, contact structure 412 may include a trapezoidal cross-sectional geometry wherein a bottom portion of the contact structure is wider than an upper portion of the contact structure. Although not shown, contact structure 412 may alternatively be formed to include a parallelogram vertical cross-sectional geometry. For example, a single opening could be formed in patterned mask 424 to the left or right end of initial contact structure 416 so that a respective leftmost or rightmost portion of initial contact structure 416 would remain to form a contact structure. The resulting contact structure may include, for example, the trapezoidal cross-sectional geometry wherein a bottom portion of the contact structure is wider than an upper portion of the contact structure. Additionally, although only one contact structure and metal wire thereon is shown, any desirable number of contact structures may be formed on gate structure 414 according to the methods described herein.

Figure 19:
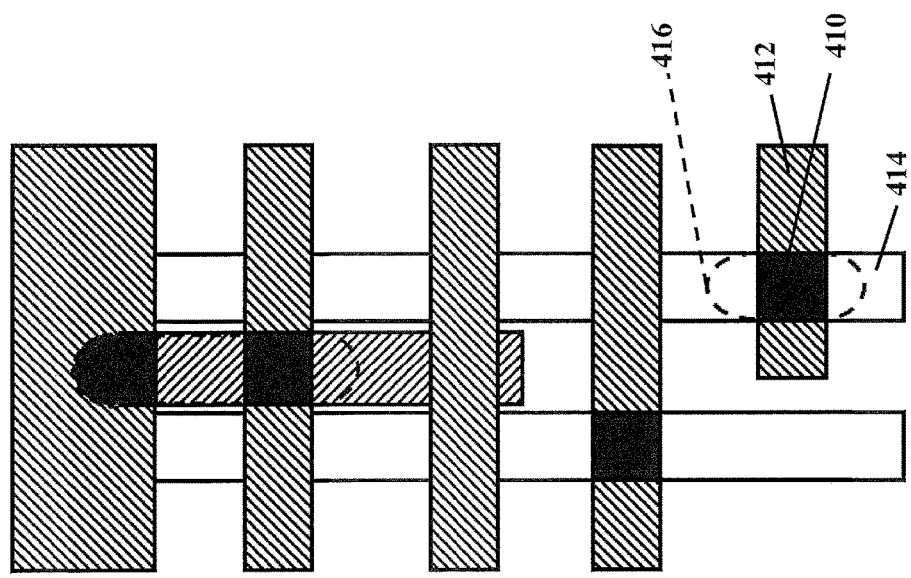
FIG. 19 shows a plan-view of a self-aligned metal wire on a contact structure on a metal gate structure, according to embodiments of the disclosure.

FIG. 19 shows a plan-view of a self-aligned metal wire 434 and contact structure 412 of FIG. 18, formed according to embodiments of the disclosure. Self-aligned metal wire 434 and contact structure 412 may be positioned on gate structure 414. In contrast to conventional contact structure 112 of FIG. 1, forming self-aligned metal wire 434 on contact structure 412 according to the embodiments of the present disclosure may result in contact structure 412 including a top cross-sectional geometry including one or no rounded edges. For example, as shown in FIG. 19, during the formation of contact structure 412, portions of initial contact structure 416 (in phantom) may be removed from both sides of the subsequently formed contact structure. As a result, in addition to the non-conventional trapezoidal vertical cross-sectional geometry as discussed above with respect to FIG. 18, contact structure 412 may include a substantially square top cross-sectional geometry. Although not shown, contact structure 412 may alternatively be formed by removing a portion of initial contact structure 416 (in phantom) from one side of the subsequently formed contact structure. As a result, the contact structure may include a top cross-sectional geometry with one rounded edge, and a vertical parallelogram cross-sectional geometry. Forming contact structure 412 to include one or no rounded edges may improve edge placement variation between the contact structure and metal wire 434 formed thereon. Forming contact structure 412 according to embodiments of the disclosure may also, for example, improve line end critical dimension uniformity (CDU). Improving edge placement variation and CDU may, for example, reduce metal wire—contact structure interface resistivity, and the variation in metal wire—contact structure interface resistivity across the semiconductor structure.

Although the method and structure described above is described in the context of a vertical fin field effect transistor (FinFET) formed on a substrate, it should be understood that the method and structure are not limited and may be applied to planar field effect transistor and/or any other metaloxide-semiconductor field effect transistors (MOSFETs).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially square" may refer to a shape having four major sides but with some variation in the shape of the sides, or the number of additional minor sides provided. "Substantially circular" may refer to a shape having the form of a circle but with some variation in the diameter throughout.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
a first contact structure in a first dielectric layer above a substrate, and
a second contact structure in the first dielectric layer, the second contact structure laterally separated from the first contact structure by the first dielectric layer,
wherein a vertical cross-sectional geometry of the first contact structure includes a trapezoid wherein a bottommost surface of the first contact structure is wider than an uppermost surface of the first contact structure, and the first contact structure further includes a top horizontal cross-sectional geometry that is substantially square, and
wherein a vertical cross-sectional geometry of the second contact structure includes a parallelogram, and the second contact structure further includes a top horizontal cross-sectional geometry that includes at least one flat side and only one rounded side.

2. The IC structure of claim 1, further comprising:
a second dielectric layer positioned above the first dielectric layer and the first contact structure; and
a metal wire in the second dielectric layer, wherein a surface of the metal wire contacts the uppermost surface of the first contact structure.

3. The IC structure of claim 2, wherein a bottommost surface of the metal wire completely contacts the uppermost surface of the first contact structure.

4. The IC structure of claim 1, wherein the bottommost surface of the first contact structure contacts one of a source and drain region above the substrate and a trench silicide structure positioned on the source and drain region above the substrate.

5. The IC structure of claim 1, wherein the first contact structure includes a first portion along at least one sidewall of the first contact including a non-metallic material, and a second portion including a conductive material.

6. The IC structure of claim 5, wherein a vertical cross-sectional geometry of the second portion includes a trapezoid wherein an uppermost surface of the second portion is wider than a bottommost surface of the second portion.

7. The IC structure of claim 1, wherein the first dielectric layer includes an air gap therein, the air gap positioned adjacent to the first contact structure.

8. The method of claim 1, wherein the first contact structure is in electrical communication with a gate positioned on an insulation region in the substrate.

* * * * *